(12) United States Patent
Kuehnis et al.

(10) Patent No.: US 11,193,973 B2
(45) Date of Patent: Dec. 7, 2021

(54) DEVICE, SYSTEM AND METHOD TO SUPPORT COMMUNICATION OF TEST, DEBUG OR TRACE INFORMATION WITH AN EXTERNAL INPUT/OUTPUT INTERFACE

(71) Applicant: Intel Corporation, Santa Clara, CA (US)

(72) Inventors: Rolf H. Kuehnis, Portland, OR (US); Sankaran M. Menon, Austin, TX (US); Patrik Eder, Taufkirchen (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/947,084

(22) Filed: Jul. 17, 2020

(65) Prior Publication Data
US 2020/0348360 A1 Nov. 5, 2020

Related U.S. Application Data

(63) Continuation of application No. 16/105,748, filed on Aug. 20, 2018, now Pat. No. 10,718,812, which is a
(Continued)

(51) Int. Cl.
*G01R 31/3177* (2006.01)
*G01R 31/317* (2006.01)

(52) U.S. Cl.
CPC ... *G01R 31/3177* (2013.01); *G01R 31/31705* (2013.01); *G01R 31/31715* (2013.01); *G01R 31/31723* (2013.01)

(58) Field of Classification Search
CPC .......... G01R 31/3177; G01R 31/31705; G01R 31/31715; G01R 31/31723
See application file for complete search history.

(56) References Cited

U.S. PATENT DOCUMENTS 7,546,507 B1 6/2009 Wright et al.
8,051,347 B2 11/2011 Varadarajan et al.
(Continued)

FOREIGN PATENT DOCUMENTS

| CN | 102255888 A | 11/2011 |
|---|---|---|
| CN | 103164314 A | 6/2013 |
| WO | 2017069823 A1 | 4/2017 |

OTHER PUBLICATIONS

International Preliminary Report on Patentability for Application No. PCT/US2016/043191, dated May 3, 2018, 10 Pages.
(Continued)

*Primary Examiner* — Kyle Vallecillo
(74) *Attorney, Agent, or Firm* — Alliance IP, LLC

(57) ABSTRACT

Techniques and mechanisms to exchange test, debug or trace (TDT) information via a general purpose input/output (I/O) interface. In an embodiment, an I/O interface of a device is coupled to an external TDT unit, wherein the I/O interface is compatible with an interconnect standard that supports communication of data other than any test information, debug information or trace information. One or more circuit components reside on the device or are otherwise coupled to the external TDT unit via the I/O interface. Information exchanged via the I/O interface is generated by, or results in, the performance of one or more TDT operations to evaluate the one or more circuit components. In another embodiment, the glue logic of the device interfaces the I/O interface with a test access point that is coupled between the one or more circuit components and the I/O interface.

20 Claims, 12 Drawing Sheets

Related U.S. Application Data continuation of application No. 15/085,945, filed on Mar. 30, 2016, now Pat. No. 10,054,636.

(60) Provisional application No. 62/245,931, filed on Oct. 23, 2015.

(56) References Cited

U.S. PATENT DOCUMENTS

| | | | |
|---|---|---|---|
| 9,477,807 B1 | 10/2016 | Harper et al. | |
| 10,067,847 B1* | 9/2018 | Habusha | G06F 11/348 |
| 2004/0186688 A1 | 9/2004 | Nejedlo | |
| 2008/0091989 A1 | 4/2008 | Bakhshi et al. | |
| 2008/0282087 A1 | 11/2008 | Stollon et al. | |
| 2009/0094401 A1 | 4/2009 | Larson et al. | |
| 2009/0119555 A1 | 5/2009 | Edgar et al. | |
| 2012/0036298 A1* | 2/2012 | Lais | G06F 13/24 710/260 |
| 2012/0036304 A1* | 2/2012 | Lais | G06F 13/4059 710/311 |
| 2013/0290594 A1* | 10/2013 | Callahan | G01R 31/317 710/313 |
| 2013/0304955 A1 | 11/2013 | Shirlen et al. | |
| 2014/0013421 A1 | 1/2014 | Hopkins et al. | |
| 2014/0207991 A1* | 7/2014 | Kaushik | H04B 7/2603 710/308 |
| 2014/0237311 A1 | 8/2014 | Swoboda | |
| 2015/0066538 A1 | 3/2015 | Dantsker et al. | |
| 2015/0067424 A1 | 3/2015 | Waltermann et al. | |
| 2015/0120969 A1* | 4/2015 | He | G06F 3/0655 710/74 |
| 2015/0254202 A1* | 9/2015 | McGlone | G06F 13/4022 710/316 |
| 2016/0077905 A1* | 3/2016 | Menon | G06F 11/3648 714/37 |
| 2016/0196233 A1 | 7/2016 | Chen et al. | |
| 2016/0283351 A1 | 9/2016 | Huang | |
| 2017/0045584 A1 | 2/2017 | Hopkins et al. | |
| 2017/0052868 A1 | 2/2017 | Robertson et al. | |
| 2017/0102995 A1 | 4/2017 | Gupta et al. | |
| 2017/0262403 A1 | 9/2017 | Chen et al. | |
| 2019/0353705 A1 | 11/2019 | Hopkins et al. | |

OTHER PUBLICATIONS

International Search Report and Written Opinion for Application No. PCT/US2016/043191, dated Oct. 28, 2016, 11 pages.

Taiwan Patent Office; Search Report and Office Action issued in TW Patent Application No. 105127709, dated Jan. 11, 2021; 14 pages including partial English translation.

SIPO; First Office Action issued in CN Patent Application No. 201680055662.6, dated Jan. 25, 2021; 28 pages including English translation.

SIPO; Second Office Action issued in CN Patent Application No. 201680055662.6, dated Jul. 22, 2021; 26 pages including English translation.

* cited by examiner

DEVICE, SYSTEM AND METHOD TO SUPPORT COMMUNICATION OF TEST, DEBUG OR TRACE INFORMATION WITH AN EXTERNAL INPUT/OUTPUT INTERFACE

CROSS-REFERENCE TO RELATED APPLICATIONS

This application is a continuation of U.S. patent application Ser. No. 16/105,748, filed on Aug. 20, 2018, which is a continuation of U.S. patent application Ser. No. 15/085,945, filed on Mar. 30, 2016, which claims the benefit of U.S. Provisional Application No. 62/245,931, filed on Oct. 23, 2015, the entire contents of which are hereby incorporated by reference herein.

BACKGROUND

1. Technical Field

Embodiment discussed herein relate generally to microelectronic circuit devices and more particularly, but to exclusively, to evaluating the operation of integrated circuitry using a general purpose interface.

2. Background Art

Currently, typical laptop, tablet, smartphone or other systems comprise a system-on-chip (SoC) and/or other integrated circuits (ICs) that are debugged and tested via a JTAG (or cJTAG) interface. Typically, it is desirable to send debug traces from system circuitry (e.g., a SoC or other IC) via a high-speed interface that exists on the system. The JTAG test data out (TDO) pin can also be used to send output debug traces, albeit at a lower data rate. Typically, the IEEE-1149.1 JTAG interface runs at about 100 MHz. The IEEE standards committee has also developed a 2-pin JTAG interface via IEEE-1149.7 standard (also known as compact JTAG or cJTAG) which uses TMSc and TCKc signals for debug and test. Since the data rate of a JTAG interface is typically around 100 Mhz and most trace requirements are much higher than the JTAG data rate, the trace is conventionally sent out of the system via a dedicated high-speed serial trace port. However, as devices trend toward "closed chassis" solutions having fewer external connectors, there is an increasing demand to eliminate external ports that are specific to supporting test, debug and/or trace information.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
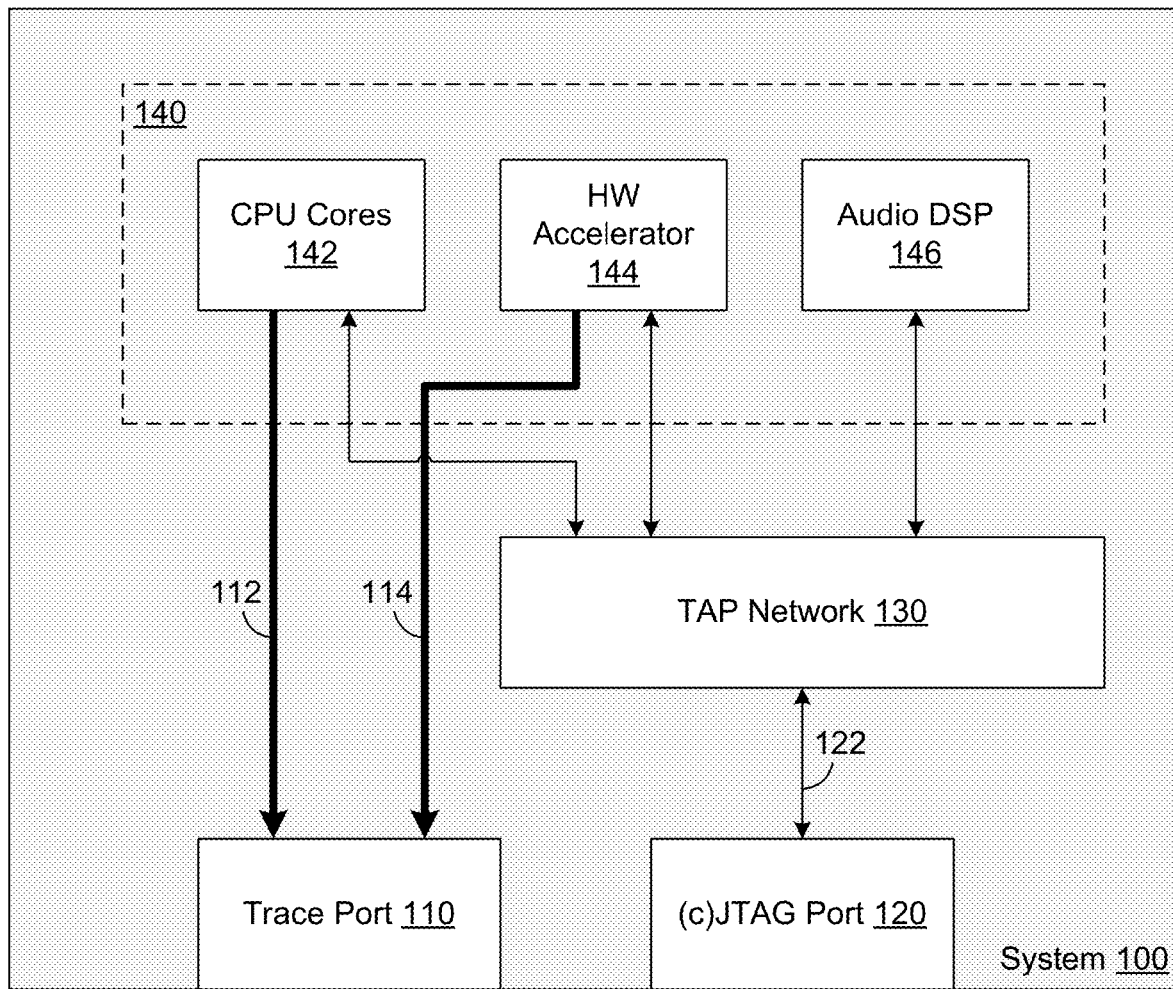
FIG. 1 is a functional block diagram illustrating elements of a system-on-chip to perform debug and trace operations according to conventional techniques.

Embodiments discussed herein variously provide techniques and/or mechanisms for adapting a general purpose input/output (IO) interface—such as one compatible with a Thunderbolt™ standard or a PCIe standard—to facilitate debug, test, and/or trace functionality. As used herein, "PCIe" refers to compatibility with a Peripheral Component Interconnect (PCI) Express (or PCIe) standard such as that of the PCIe 3.1 specification released November 2014 by the PCI Special Interest Group (PCI-SIG), the PCIe 4.0 specification announced Nov. 29, 2011 by the PCI-SIG or any of various other such standards. The term "Thunderbolt™" (or "TBT") refers herein to characteristics compatible with Thunderbolt™ 2 requirements, Thunderbolt™ 3 requirements or other types of Thunderbolt™ interfaces. Certain features of various embodiments are discussed herein with reference to an external interface which is "PCIe/TBT"—that is, either a PCIe interface or a Thunderbolt™ (TBT) interface, and which is used to exchange TBT information with "test access port network" (i.e., an network of test access ports that is internal to a system). However, such discussion may be extended to include any of various other types of external interfaces and/or any of various other types of internal system networks. For example, some embodiments may instead exchange TDT with a "debug access port network" (i.e., a network of debug access ports of various components in a system). Serial Wire Dubug (SWD) ports are just one example of ports that may be interconnected with one another to form a debug access port (DAP) network to participate in TDT exchanges with a PCIe, TBT or other functional interface.

As used herein, "test/debug/trace" (or "TDT"), refers to functionality that supports testing, debugging and/or tracing operations and/or functionality that supports the communication of debug information, test information and/or debug information based on (or otherwise in support of) such operations. "External interface" is used herein to refer to a wired or wireless interface of a system, the interface to provide communicative coupling of the system to an external agent. An external interface may be general-purpose at least insofar as it is configured to support one or more types of communication other than that to support TDT functionality. For example, an external I/O interface may be compatible with a peripheral interconnect standard (e.g., a PCIe standard or a Thunderbolt™ standard) that supports communication of operational data other than any test information, debug information or trace information.

The term "M.2" refers herein to compatibility with a M.2 standard such as that of the PCI-SIG M.2 specification or the SATA Rev. 3.2 specification. M.2 connectors, also formerly known as NGFF (Next Generation Form Factor) connectors may be used for internally mounted expansion cards and connectors. These may provide a replacement for mSATA standard connectors, and support PCI express mini cards and connectors. As used herein, "(c)JTAG" refers to compatibility with a Joint Test Action Group (JTAG) standard such as that of the IEEE 1149.1 specification of the Institute of Electrical and Electronics Engineers (IEEE) or a compact JTAG (cJTAG) standard such as that of the IEEE 1149.7 specification of the IEEE. The term "USB" refers herein to compatibility with a Universal Serial Bus (USB) standard such as that of the USB 3.0 specification released November 2008 by the USB Implementers Forum, the USB 3.1 specification released 31 Jul. 2013 or other such standards. The term "WiFi" refers herein to compatibility with any of various wireless communications standards, such as those of the WiFi Alliance or the Bluetooth Special Interest Group, that are based on the IEEE 802.11 specification of the IEEE.

Existing systems—e.g., including platforms, SoCs, etc. of tablets, laptops, desktops, smart phones or the like—typically contain several components (chips, packages, etc.) that are configured to be individually debugged, where for each component, there is a respective connector for coupling the component to some debug software unit. The debugging may include operations to analyze, optimize and/or observe operation of the components. Such components may include, for example, one or more of a modem, application processor, different chips, wireless LAN, and or the like. These components are traditionally debugged individually. Historically, there has been a dedicated interface (a separate connector) for each component to connect to a test unit including debug software/hardware logic. Such debug may tune the component—e.g., to provide a modem with improved bandwidth, an application processor with improved response time, etc.

FIG. 1 shows a typical system 100 that supports debugging using conventional mechanisms. System 100 includes one (c)JTAG port 120—a 4-pin (or 5-pin) JTAG connector or a 2-pin cJTAG connector—that supports an exchange of test and/or debug information with a test access point (TAP) network 130 of system 100. Components 140—which are shown as including the illustrative including central processing unit (CPU) cores 142, hardware (HW) accelerator 144, and audio digital signal processor (DSP) 146—are connected to TAP network 130, which in turn is interfaced to (c)JTAG port 120. An external debugger (not shown) accesses components 140, via signaling between the (c)JTAG port 120 and TAP network 130, to read one or more registers of a given component. An additional trace port 110 of system 100 aids in a streaming and/or other exchange of trace information 112, 114. Since the data rate of a JTAG interface is typically around 100 Mhz and most trace requirements are much higher than the JTAG data rate, the trace is conventionally sent out of the system via a dedicated high-speed serial trace port 110.

Some embodiments are based on a realization that there are some types of connectors—capable of interfacing a system with an external agent and/or network—that may be exploited to access an internal network of such a system, where the internal network facilitates debug, test and/or trace of multiple system components. Such embodiments provide functionality to exchange debug, test and/or trace information via one common hardware interface that supports such external connection. The external connector may be "owned" by a particular component of the system, at least insofar as access to one or more other system components may be via that particular component. Such a connector may conform to a standard (e.g., such as one of a PCIe specification and/or a Thunderbolt™ type) that is not limited to a particular communication type such as communication of debug, test and/or trace information. The terms "general-purpose I/O", "in-band", "functional" are used herein to describe the characteristic of such an interface not being limited to the communication of debug, trace and/or test information. Although certain embodiments are not limited in this regard, the standard with which an external connector is compatible may provide for a "push model" protocol—e.g., wherein commands from a host/source/etc. agent are pushed to a memory or client/sink/etc. component. PCIe and Thunderbolt™ are examples of push model interface types—e.g., where USB is an example of a pull model interface type.

Alternatively or in addition, an internal network of a system (the network accessed only via an external connector of the system) may include one or more buses and/or other interconnects that conform to an interconnect standard—such as that of a PCIe specification, for example. Certain embodiments variously enable one or more external system interface connectors to be variously eliminated, or at least more efficiently utilized. Instead of using dedicated access points, some embodiments utilize a network, inside of a system, to perform (for example) debug, test and/or trace operations. PCIe is merely one example of such a network mechanism. In some illustrative embodiments, an externally accessible (e.g., Thunderbolt™) connection is used to access an internal network between system components, such as hard drives, etc. With such a Thunderbolt™ (or other) connection, some embodiments support use of a daisy-chain configuration to connect different devices with one another. With networked debug functionality, a single connection to an external component allows for a debug host to debug over this connection to complete device and potentially all the devices which are chained up.

Certain embodiments variously provide for debug operations that rely on a protocol, for an external interface, that utilizes a push-type information exchange. For example although USB protocols variously communicate using a pull model, PCIe/Thunderbolt™ instead implements a push model, wherein (for example) commands are pushed to a memory of a system from an external agent. An external (functional) interface of a system/platform may be used to access to multiple functional blocks of system/platform. Some embodiments, access to such multiple functional blocks may be via one or more wireless interfaces and/or a daisy-chained configuration of some or all such functional blocks. An interconnect (such as a PCIe bus) between two such functional blocks may enable one system component act as an intermediary for debug and/or testing of one or more other components—e.g., wherein the one or more other components are in the same system or external to the system.

As used herein, the term "closed chassis" refers to the characteristic of a system lacking, at its outermost housing or other enclosure, an external interface that is dedicated to supporting only one or more types of TBT functionality. In an embodiment, components of a closed-chassis system are coupled to an external (PCIe, TBT, M.2 or other) interface, where TBT-related communications and/or operations are to be supported via the interface. At least one advantage of some embodiments is that the adaptation of PCIe or Thunderbolt™ to support debug functionality—e.g., rather than using USB. Next-generation interface technology is expected to trend more toward PCIe/Thunderbolt™ due to the support of high rate (e.g., 20 Gbps and 40 Gbps) signaling.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including an external interface and components configured to participate in TBT operations supported via the external interface.

To speed up debug and/or other TDT communications, PCIe and/or Thunderbolt™ (for example) may be used, in an embodiment, to interface with a network of test access points—or "TAP network"—and/or to use as a trace destination for traces sent by various system components. A multiplexing (muxing) mechanism to select between the various trace sources may be implemented in a central component or, alternatively, some combination of components that operate together to implement muxing functionality.

Figure 2:
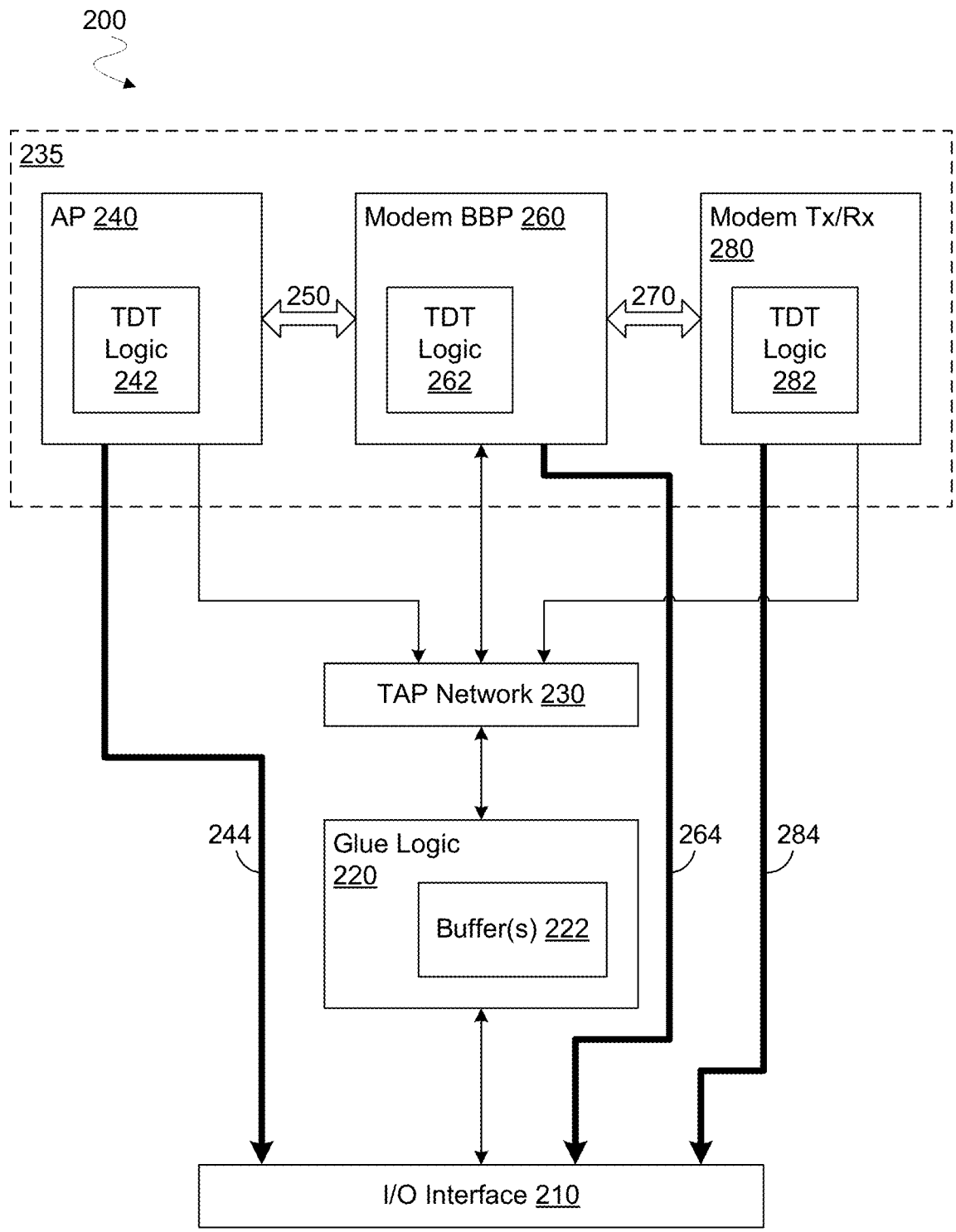
FIG. 2 is a functional block diagram illustrating elements of a system to provide perform test, debug or trace (TDT) functionality according to an embodiment.

FIG. 2 shows a system 200—e.g., a SoC, laptop, tablet, smartphone, etc.—to support communication and/or other operations for TDT evaluation of circuitry according to an embodiment. System 200 may be a closed chassis system wherein an external interface, by which system 200 is to access an external TDT agent, is not dedicated to only TDT communications. System 200 includes a functional (e.g., general-purpose) I/O interface 210—such as a PCIe interface or Thunderbolt™ interface—to enable coupling of system 200 to an external TDT unit. M.2 is another example of an external interface type that may be adapted for TDT. Still other examples, according to some embodiments, include USB, Wifi or other external interface mechanisms. In some embodiments, system 200 further includes an external TDT-dedicated interface (not shown), where at least some TDT exchanges may nevertheless take place via I/O interface 210.

System 200 is an example of an embodiment wherein TDT access is facilitated with functional I/O interface 210 and an internal TAP network 230 coupled to some or all of components 235—e.g., allowing ease of debug. In the illustrative embodiment shown, components 235 include an application processor 240, modem baseband processor BBP 260 and a modem transceiver (Tx/Rx) 280. However, system 200 may include more, fewer and/or different components, in other embodiments. In one illustrative embodiment, modem Tx/Rx 280 or other circuitry of components 235 provides Wifi, Bluetooth, frequency modulated (FM) radio and/or other wireless functionality.

Components 235 may be variously coupled to one another via one or more interconnects, such as the illustrative PCIe buses 250, 270 shown. Inter-Processor Communication (IPC) links may be used between various processing cores and/or other components of system 200. For example, interconnect 250 may include, or be coupled via, an IPC-PCIe interface between AP 240 and modem BBP 260. One advantage of such an embodiment may be that an entire SoC may be evaluated using (c)JTAG and/or trace exchanges via functional I/O interface 210. Conventional techniques instead rely on dedicated debuggers—each for a different respective component and/or each coupled via a respective debug port. In one illustrative embodiment, interconnect 270 supports communications that are compatible with a DigRF specification such as the Specification DigRFSM v4 v1.10 released December 2011 by the MIPI Alliance. However, such communications may not support direct control through a PCIe network. In such a case, a debug protocol may be tunneled in such DigRF communications.

System production, testing, validation, debug and/or the like may be improved by the use of functional I/O interface 210 to access an internal TAP network for TDT. Through functional I/O interface 210, an external debug tool, or other such TDT agent, may access different components 235 of system 200—e.g., to set up a trace stream, to access registers in any of various components and/or the like. System 200 may further comprise glue logic 220 comprising circuitry, firmware, software and/or other logic to provide an interface between TAP network 230 and functional I/O interface 210. For example, functional I/O interface 210 may include some or all of a PHY, protocol stack and/or other logic that operates according to a PCIe, Thunderbolt™ or other such functional I/O standard. Glue logic 220 illustrates one example of hardware and/or executing software to interface functional I/O interface 210 (e.g., PCIe protocol logic thereof and/or Thunderbolt™ protocol logic thereof) with TAP network 230. Such interface logic may implement a speed translation to accommodate different signal communication rates. For example, glue logic 220 may include or otherwise have access to one or more buffers 222. Glue logic 220 may control buffering and debuffering by one or more buffers 222 to store information received from functional I/O interface 210 at a first rate, where such data is subsequently debuffered for communication via TAP network 230 at a second rate (e.g., 100 MHz) lower than the first rate. Alternatively or in addition, such buffer control may store (e.g., to a different buffer) data received from TAP network 230 at a relatively slow rate, where such information is subsequently debuffered for communication via functional I/O interface 210 at a much faster rate. Glue logic 220 may thus operate as a PCIe-to-TAP (PCIe2TAP) interface and/or a Thunderbolt™-to-TAP (TBT2TAP) interface.

Various traces—such as the illustrative trace streams 244, 264, 284 from AP 240, modem baseband 260 and modem RF 280—may be brought to functional I/O interface 210 for communication to an external debug tool. A muxing mechanism to select between the various trace sources may be implemented either in a central component or in one of the components that may accommodate this logic. Although trace streams 244, 264, 284 are shown as bypassing TAP network 230 and glue logic 220, certain embodiments are not limited in this regard, and some or all such trace streams may require processing—e.g., at glue logic 220—in preparation for communication from system 200 according to a PCIe protocol or a TBT protocol.

In the illustrative embodiment shown, TDT access to AP 240, modem BBP 260 and modem Tx/Rx 280—e.g., including (c)JTAG (or other) debug access and/or trace access—may be variously supported by respective TDT logic 242, 262, 282. Such TDT logic 242, 262, 282 may variously provide some trace, debug and/or test functionality adapted from conventional techniques. In some embodiments, one or more of TDT logic 242, 262, 282 provides functionality for a component to load and execute a local TDT agent to perform a TDT evaluation of that same component or another component, for example. Alternatively or in addition, one or more of TDT logic 242, 262, 282 may provide functionality to represent the corresponding component as being a type of device (e.g., a multi-function device identified as such using a modified PCIe class convention) that supports a TDT functionality.

TDT accesses and exchanges may be vastly improved by the data rates supported with PCIe and Thunderbolt™—e.g., rates including 5 gigabits per second (Gps) or even up to 20 Gps and 40 Gps. By contrast, TAP exchanges such as those performed at system 100 have traditionally been on the order of about 100 megahertz. Some embodiments can go through functional (e.g., Thunderbolt™) I/O interface 210 to access an application processor (AP) 240 and to execute an agent process therein. The agent may exchange TDT commands/queries via an internal network of system 200 (e.g., such as a network including PCIe buses 250, 270). In response, one or more other components of system 200 may send information back to AP 240 for evaluation, forwarding and/or other processing.

System 200 may include one or more additional or alternative connectors (e.g. a M.2 connector of a storage module or communication module) that supports PCIe mechanisms. Such a connector may support connection of system 200 to a test or debug tool that is to access components internal to system 200—e.g., for boundary scan, built-in self-test (BIST), fusing, flashing, testing and/or debugging.

Figure 3:
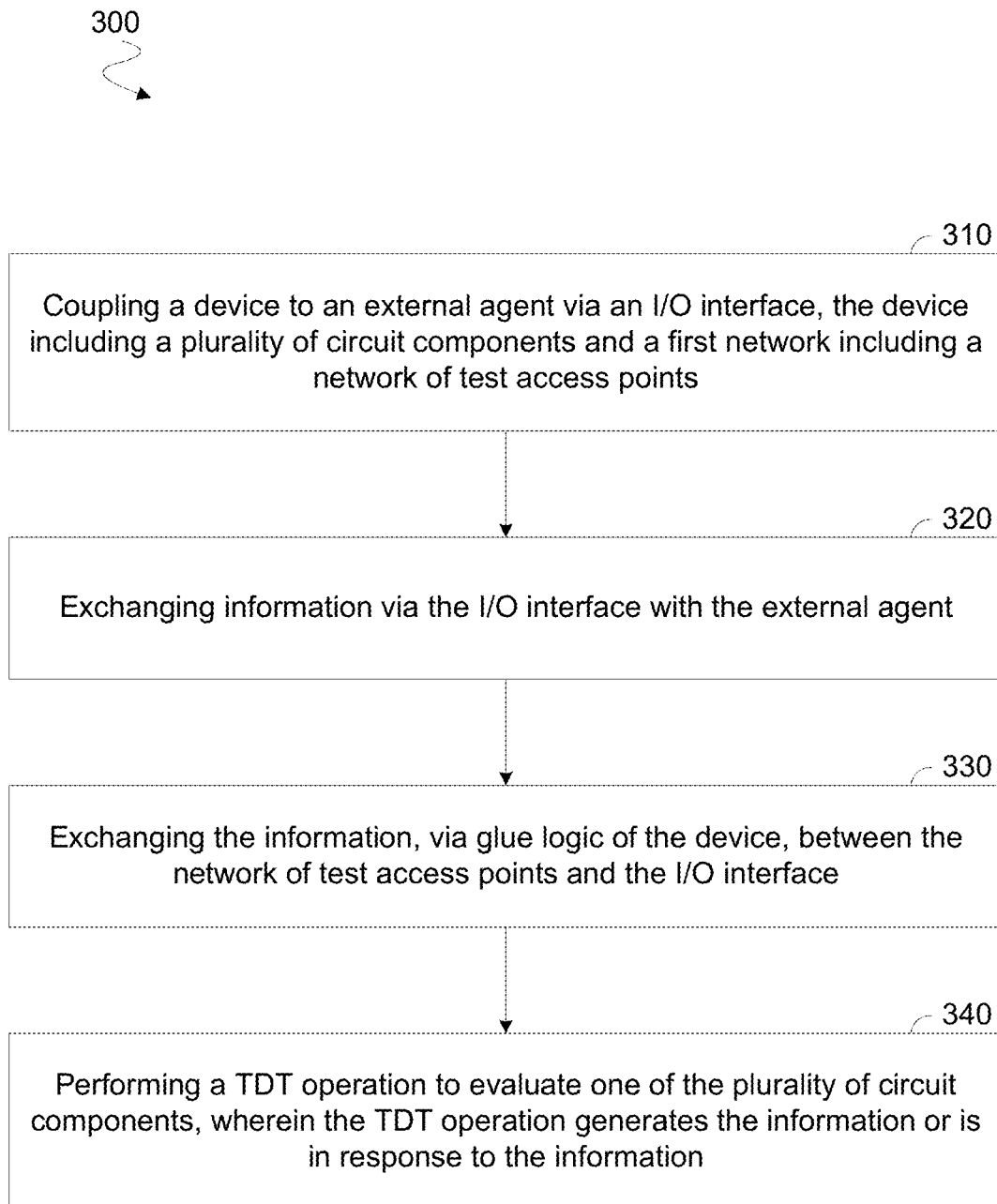
FIG. 3 is a flow diagram illustrating elements of a method to evaluate a circuit component according to an embodiment.

FIG. 3 illustrates elements of a method 300, according to an embodiment, to perform TDT operations based on communications via a functional interface. Method 300 may be performed at an IC chip, packaged device, computer platform or other hardware having some or all features of system 200, for example.

Method 300 may include, at 310, coupling a device to an external agent via an input/output (I/O) interface of the device. In an embodiment, the device—e.g., which may be or otherwise include system 200, for example—comprises a plurality of circuit components, such as components 235. The device may further comprise a first network coupling the plurality of circuit components to one another, the first network including access points interconnected to exchange TDT information. Such a first network may including a network of test access points (a TAP network) coupled between the plurality of circuit components and the I/O interface. In an embodiment, the I/O interface is compatible with a peripheral interconnect standard (e.g., a PCIe standard or a Thunderbolt™ standard) that supports communication of operational data other than any test information, debug information or trace information.

In an embodiment, method 300 further comprise, at 320, exchanging information via the I/O interface with the external agent, and exchanging the information via glue logic of the device, at 330, between the network of test access points and the I/O interface. The exchanging at 330 may include the glue logic adjusting communication of the information between a first rate of the I/O interface and a second rate of the network of test access points. For example, the glue logic may include one or more buffers, where the glue logic adjusts the rate of communication of the information by variously buffering and de-buffering data with the one or more buffers at different respective rates.

In some embodiments, the exchanging at 330 includes mapped I/O information that identifies configuration state and/or other information describing one or more of the circuit components. For example, the device may further comprise a second network that interfaces with the first network via logic (referred to herein as a bus access unit) that is coupled between the first network and second network. The second network may support communications having a different format, data rate and/or other characteristic than that supported by the first network. Alternatively or in addition, the second network may be coupled to exchange information other than any TDT information. The bus access unit may provide functionality to adjust between different respective communication rates of the first network and the second network. In such an embodiment, the exchanging at 330 may include the glue logic exchanging memory mapped I/O information, wherein such memory mapped I/O is accessed via the second network. The exchanging at 330 may further comprise the bus access unit adjusting a rate of communication of such memory mapped I/O information.

Method may further include, at 340, performing a TDT operation to evaluate one of the plurality of circuit components. In an embodiment, the TDT operation generates the information or is performed in response to the information. For example, the information may include software code provided by the external agent, wherein performing the TDT operation includes a first circuit component of the plurality of circuit components executing the software code. Execution of the software code may result in the first circuit component providing a TDT process that evaluates the first circuit component and/or some other circuit component of the device. Alternatively or in addition, information exchanged at 320 and 330 may include one or more commands to be serviced by a TDT agent, results of a TDT operation and/or the like.

Figure 4:
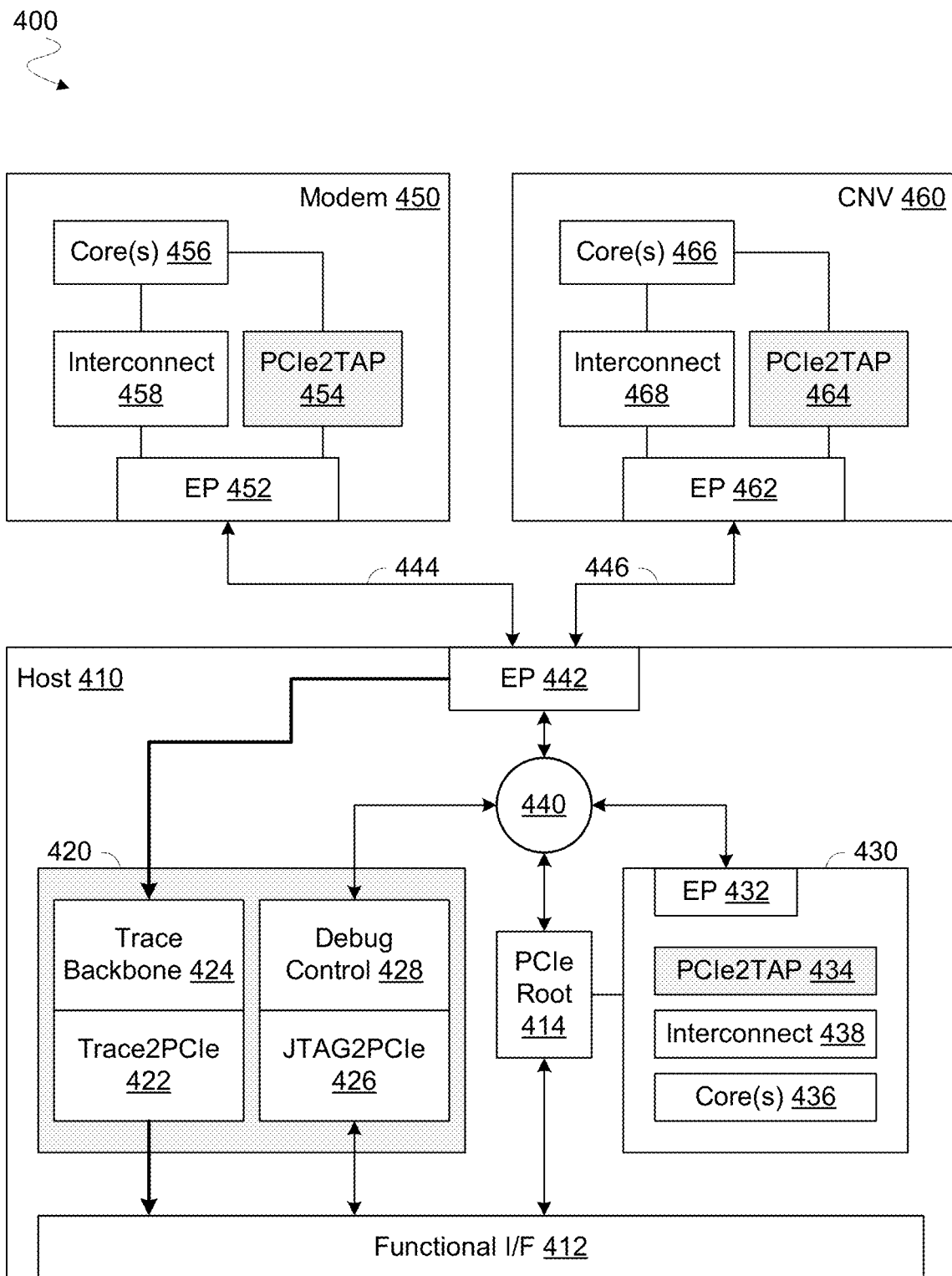
FIG. 4 is a functional block diagram illustrating elements of a system to support trace and debug operations according to an embodiment.

FIG. 4 illustrates elements of a system 400 to perform TDT operations according to an embodiment. System 400 is one example of an embodiment wherein one device of a platform hosts TDT glue logic functionality for other devices of the platform. System 400 may include some or all of the features of system 200, for example. In one embodiment, method 300 is performed at system 400.

System 400 comprises a host 410 which includes, or is coupled to, a functional interface (I/F) 412 that provides for coupling of system 400 to a debug tool and/or other external TDT agent (not shown). For example, functional I/F 412 may reside on a SoC or on a computer platform including a SoC and/or one or more other IC devices. Host 410 may facilitate TDT operations to evaluate one or more components of system 400, such as the illustrative modem 450 and connectivity logic CNV 460 (e.g., including Bluetooth, wireless LAN and/or other such circuitry).

By way of illustration and not limitation, glue logic 420 of host 410 may enable an exchange of TDT information between functional I/F 412 and a TAP network which (for example) comprises respective endpoints EP 422, EP 452 and EP 462 of host 410, modem 450 and CNV 460. As used herein, "end-point" (or "EP") refers to a logic terminus of a communication link. The TAP network may further comprise links—e.g., including the illustrative links 444, 446—variously coupling EP 422, EP 452 and EP 462 to each other.

A trace backbone 424 of glue logic 420 may include circuitry to control communication and/or other operations that, for example, are adapted from conventional trace techniques. To provide for an exchange of trace information, interface logic, represented functionally as Trace2PCIe 422, may provide buffering, data rate conversion and/or other functionality to facilitate communication between the TAP network (via trace backbone 424) and PCIe mechanisms that are included in, or operate with, functional I/F 420. Alternatively or in addition, debug control 428 may include circuitry to control communication and/or other operations that, for example, are adapted from conventional (c)JTAG and/or other debug techniques. Additional interface logic, represented functionally as JTAG2PCIe 426, may similarly facilitate communication of debug information between the TAP network (via debug control 428) and PCIe mechanisms that are included in, or operate with, functional I/F 420.

In the illustrative embodiment shown, host 410 includes local resources—e.g., including the illustrative processor 430—that are to be evaluated by and/or otherwise participate in TBT operations. Processor 430 may include one or more cores 436—e.g., of a central processing unit (CPU), application processor or the like—to implement software, firmware and/or other logic such as that to provide a host operating system (OS), a user interface and/or the like. An interconnect 438 of processor 430 may facilitate connection of one or more cores 436 to other components (not shown) of processor 430—e.g. where some or all such components are to be evaluated by TBT processes according to an embodiment. Alternatively or in addition, interconnect 438 may provide access to an external communication path that, for example, is to transmit trace information from processor 430. In one embodiment, processor 430 includes local interface logic—represented by functional block PCIe2TAP 434—comprising circuitry to interface PCIe mechanisms of processor 430 with the TAP network. By way of illustration and not limitation, circuitry of PCIe2TAP 436 may provide buffering, speed translation and/or other glue logic functionality in support of an exchange between an internal network (e.g., including PCIe hardware of interconnect 438) and respective circuitry, variously residing on components, that are to generate trace data.

An endpoint EP 432 of processor 430 may be coupled to EP 422 via a switch 440 that, for example, also facilitates debug and/or other TDT communications between EP 442 and glue logic 420. Processor 430 may be further coupled to switch 440 via a PCIe root 414—e.g., where PCIe root 414 provides for general-purpose (e.g., other than TDT) exchanges with functional I/F 412 and/or any of various components such as modem 450 and NCV 460. The particular architecture in host 410 by which processor 430 is coupled to functional I/F 412, glue logic 420 and/or EP 442 is merely illustrative, and not limiting on some embodiments.

One or more components coupled to host 410 may include respective mechanisms—e.g., similar to those of processor 430—to variously participate in TBT operations. For example, modem 450 may include one or more processor cores 456 and logic (represented functionally by PCIe2TAP 454) that provides for interfacing between the TAP network and PCIe mechanisms internal to modem 450. Such internal PCIe mechanisms may be used, for example, for one or more cores 456 to access or otherwise manage other resources (not shown) of modem 450, the other resources coupled to via an interconnect 458. Some or all such other resources may be evaluated by TDT operations according to an embodiment. Alternatively or in addition, CNV 460 may include one or more cores 466, PCIe2TAP 464 and an interconnect 468 that—at least with respect to TDT operations—provide functionality similar to the respective functionality of one or more cores 456, PCIe2TAP 454 and interconnect 458.

Endpoint components of system 400 may be variously coupled to one another—e.g., via one or more PCIe busses. A PCIe network may include a path or paths that are adapted, according to an embodiment, to facilitate streaming and/or other exchanges of trace information. Memory I/O based mechanisms—such as those supported according to PCIe—may be adapted for read or write access to registers for exchanging TBT data, commands and/or other information. In the illustrative embodiment shown, access to exchange trace information with modem 450 and/or CNV 460 is via processor 430 and functional I/F 412. Functional I/F 412 may additionally or alternatively include circuitry and/or other hardware that conforms to a Thunderbolt™ standard, for example. In some embodiments, the functional I/F 412 includes circuitry and/or other hardware that conforms to a USB standard or a WiFi standard.

Certain embodiments adapt various PCIe and/or other external interface mechanisms—such as device classes—to support additional TBT functionality. Some embodiments introduce the use of a Debug Device class to implement debug operations via PCIe—e.g., where the Debug Device class is used to expose debug capability over a PCIe endpoint. In an embodiment, a system component to be debugged (a "debug slave") may not be identified to a debug host agent as a standalone device. Rather, the debug slave may be represented as function of the PCIe endpoint through which the debug host accesses the debug slave. The representation may be implemented, for example, using a PCIe multifunction device option—e.g., such as that indicated in a Header Type field of a PCIe header space. Debug functionality may thus be selectively exposed (or alternatively hidden) based on device settings, avoiding the need for allocating and managing dedicated endpoint configuration information for a debug slave component.

Additionally or alternatively, PCIe functions may be adapted to variously use subclasses and program interfaces—e.g., to implement in system 400 one or more separate driver instances each to implement respective data handling and/or component configuration. In an embodiment, a trace driver executing in one of modem 460 and CNV 460 can thus operate as a standalone agent after a boot up. Alternatively or in addition, such one or more trace driver instances may be variously setup by one central system driver—e.g., at host 410—registering, for various system components, where respective trace information is to be handled by corresponding drivers.

In one illustrative embodiment, a Configuration subclass may be exposed by any device of a Debug Device class. The Configuration class may be used to expose an interface to a debug topology of the debug slave—e.g., in the form of a hierarchical tree or linked list. Alternatively or in addition, a Debug Access class may be used to expose functionalities such as built-in self-test (BIST), scan and software (SW) code debug. These functionalities may support breakpoint mechanisms, run control and/or other features.

In some embodiments, a Trace class may be used to configure output paths of trace sources. Depending on the implementation, trace data may be read out over this interface or written by the device itself. Alternatively or in addition, a Trace configuration subclass may expose a trace source configuration and, in some embodiments, a configuration needed to store one or more traces outside of the traced device. Such a Trace Configuration subclass may be used to communicate, for example, selection of either a PULL or a PUSH functionality, a base address for a DMA write and/or the like. Current PCIe standards do not define any such Debug Device class or Trace class, for example.

Figure 5:
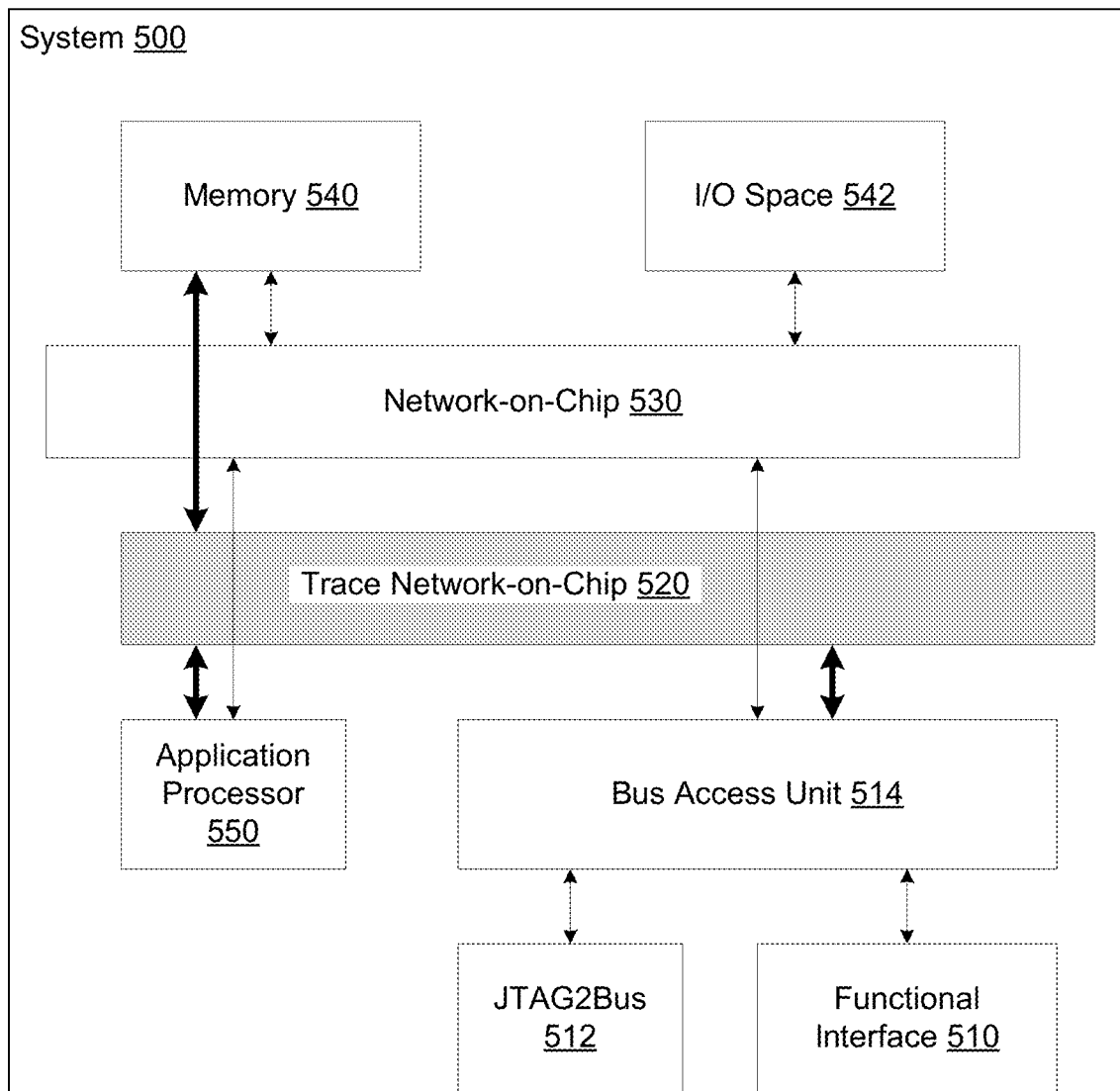
FIG. 5 is a functional block diagram illustrating elements of a system to evaluate circuitry based on memory mapped input/output information according to an embodiment.

FIG. 5 shows features of a system 500, according to another embodiment, including an external (e.g., PCIe or Thunderbolt™) interface configured to provide TDT access to memory and/or I/O space. System 500 may include features of one of systems 200, 400, for example. In one embodiment, some or all of method 300 is performed at system 500.

System 500 includes a functional interface 510 (e.g., including an external PCIe connector or Thunderbolt™ connector) coupled to a bus access unit 514. Bus access unit 514 includes circuitry to provide access to a trace network-on-chip (NoC) 520—e.g., where the trace NoC 520 is dedicated to exchanging trace information and is distinguished, for example, from a general-purpose NoC of system 500. The trace NoC 520 may in turn provide access (for example) to memory 540, I/O space 542 and/or memory space in an application processor 550 of system 500. Such access may support run and/or trace control functionality.

Functionality of bus access unit 514 may be similar to the speed translation (glue logic) functionality discussed herein with respect to a PCIe2TAP or other such interface logic. Such glue logic may match interface speeds. For example, trace NoC 520 may include a relatively slow 32-bit or 64-bit bus, whereas a PCIe interface provides serial communication—e.g., at a field rate of 8 gigahertz. In such an embodiment, the bus access unit 514 may comprise buffer circuitry and serializer/de-serializer circuitry to accommodate exchanges between the two interface types. In another embodiment, system 500 does not include a dedicated trace NoC, and bus access unit 514 facilitates trace exchanges via the general-purpose NoC 530.

In an embodiment, other TDT exchanges are performed by an interface other than functional interface 510. By way of illustration and not limitation, system 500 may include another external interface—represented functionally as the illustrative JTAG2Bus 512—that is dedicated to communicating debug information (e.g., including debug commands, outputs, etc.). In addition to (c)JTAG connector hardware, for example, JTAG2Bus 512 may further include circuit logic facilitate buffering, speed matching and/or other glue logic functions to interface with bus access unit 514.

To support high-throughput exchanges of debug information as well as to obtain high speed access for trace operations, PCIe and/or other mechanisms may be provided at NoC 530 to support memory mapped input/ouput (MMIO) access to respective resources of AP 550, memory 540 or in the I/O space 542. Trace sources may thus be accessed via a high-speed PCIe/Thunderbolt™ interfaces over a trace NoC 520. A muxing mechanism to select between the various trace sources may be implemented either in a central module or across multiple components. Thicker lines are used in FIG. 5 to represent trace signal paths.

Figure 6:
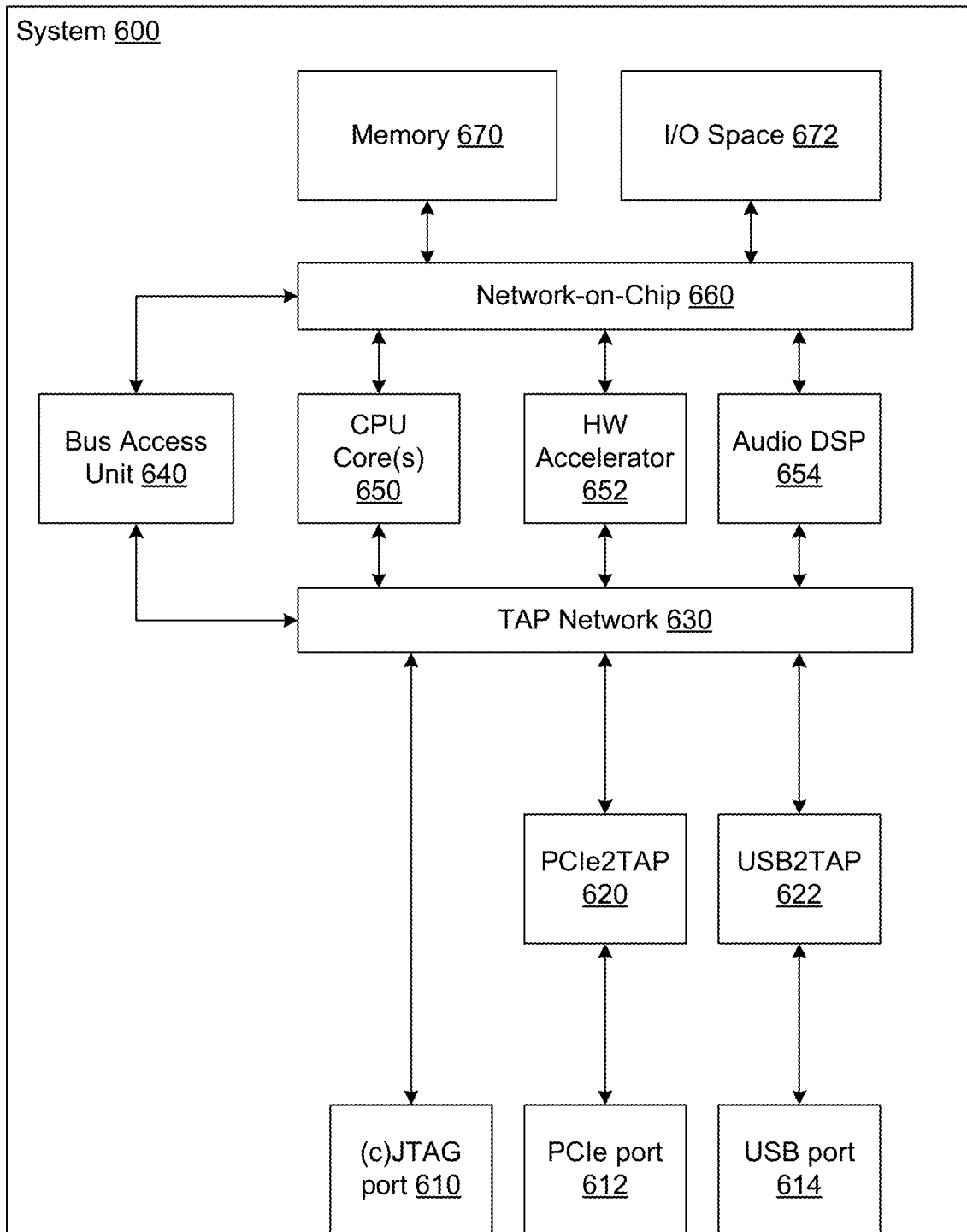
FIG. 6 is a functional block diagram illustrating elements of a system to evaluate circuitry based on memory mapped input/output information according to an embodiment.

FIG. 6 illustrates elements a system 600 to perform TDT operations according to another embodiment. System 600 may include features of one of systems 200, 400 and 500, for example. In one embodiment, some or all of method 300 is performed at system 600. System 600 is one example of a system including both multiple (e.g., nested) layers of interface logic—including, for example, (1) first interface logic coupled between a TAP network and a functional interface, and (2) second interface logic coupled between the TAP network and another internal network. One functional interface of system 600 may include PCIe/TBT circuitry and/or other hardware. Such a functional interface may access the TAP network via interface logic that provides speed speed translation, buffering and/or other interface functionality, such as that described herein. The TAP network may provide access to any of a variety of components including, for example, CPU cores, a hardware accelerator, an audio digital signal processor and/or the like. In an embodiment, the TAP network may further access a bus access module that, in turn, provides access to a NoC and, in some embodiments, one or more components (such as a memory and an I/O space) that are coupled via the NoC. Interface logic (such as PCIe2TAP circuitry or TBT2TAP circuitry) may further provide an arbitration state machine or other such logic to facilitate handshaking/coordination between components.

In the illustrative embodiment of system 600, one or more functional interfaces—e.g., including a PCIe port 612 and/or a USB port 614—may be configured to support TDT communications and/or other operations to evaluate components of system 600. In the illustrative embodiment shown, such components may include one or more CPU cores 650, a HW accelerator 652, an audio DSP 654. Debug operations to evaluate some or all such components may be performed via one of PCIe port 612 and USB port 614. In other embodiments, a dedicated external debug interface, such as the illustrative (c)JTAG port 610, may provide connectivity to an external debug agent.

TDT access to components of system 600 may by variously facilitated by a TAP network 630 and, in some embodiments, by another internal network such as the illustrative NoC 660. Glue logic of system 600 may include a first interface (represented as PCIe2TAP 620) between PCIe port 612 and TAP network 630. PCIe2TAP 620 may facilitate a debug capability of system 600—e.g., where PCIe2TAP 620 operates to generate (c)JTAG sequences based on PCIe commands that are received from an external debugger agent coupled to PCIe port 612. Glue logic of system 600 may additionally or alternatively include a second interface, represented as USB2TAP 622, between USB port 614 and TAP network 630. PCIe2TAP 620 and USB2TAP 622 may variously provide buffering, data rate matching and/or other interface functionality, as described herein. The TAP network 630 and NoC 660 may interface with one another via glue logic such as that provided by the illustrative bus access unit 640.

Memory I/O based mechanisms—such as those supported according to PCIe—may be adapted for read or write access to registers for exchanging TBT data, commands and/or other information. For example, PCIe functionality may be exploited, using PCIe2TAP 620, to access TAP network 630 and, in turn, components that might otherwise be debugged using (c)JTAG port 610. The TAP network 630 may have access—e.g., independent of NoC 660—to some or all of one or more CPU cores 650, a HW accelerator 652, audio DSP 654 and/or the like. Such access may be based on memory mapped I/O information that, for example, is available via a memory 670 and/or an I/O space 672 that are coupled to NoC 660. For example, the TAP network 630 may access a register space in memory 670 and I/O space 672 via a bus access module 640 and network-on-chip 640.

Figure 7:
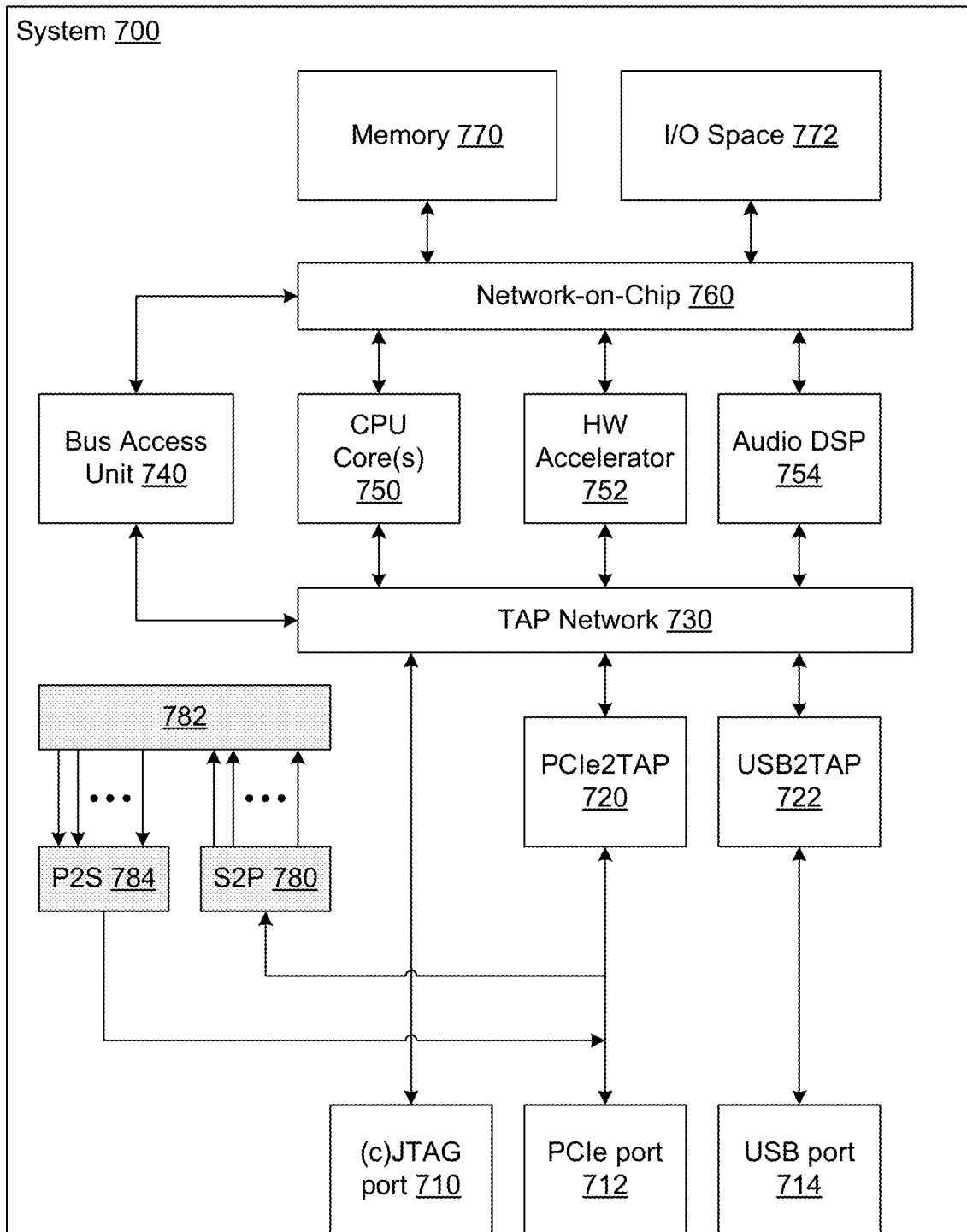
FIG. 7 is a functional block diagram illustrating elements of a system to perform TDT operations according to an embodiment.

FIG. 7 illustrates elements a system 700 to perform TDT operations according to an embodiment. System 700 may include features of system 600, for example. In one embodiment, some or all of method 300 is performed at system 700. External ports of system 700 may include some or all of a PCIe port 712, USB port 714 and (c)JTAG port 710 that provide functionality corresponding, for example, to the respective functionality of PCIe port 612, USB port 614 and (c)JTAG port 610. Components of system 700 to be evaluated by TDT operations may include one or more CPU cores 750, HW accelerator 752 and audio DSP 754 (corresponding, for example, one or more CPU cores 650, HW accelerator 652 and audio DSP 654, respectively). Such TDT operations may variously exchange trace, debug and/or test information via some or all of a TAP network 730, bus access unit 740 and NoC 760 (e.g., having functionality corresponding to the respective functionality of TAP network 630, bus access unit 640 and NoC 660). Glue logic to facilitate these exchanges may include PCIe2TAP 720 and USB2TAP 722 (e.g., corresponding to PCIe2TAP 620 and USB2TAP 622, respectively). TDT access to evaluate components of system 700 may include or otherwise be based on access to memory mapped I/O information that enables access to or otherwise describes such components. Some or all such memory mapped I/O information may be stored, for example by memory 770 and/or I/O space 772 (having functionality corresponding, for example, to the respective functionality of memory 670 and I/O space 672).

System 700 is an example of an embodiment including mechanisms for enabling test modes (e.g., for scan testing, memory testing, etc.)—e.g., instead of or in addition to otherwise conventional debug functionality. In an embodiment, a serial-to-parallel (S2P) interface of system 700 receives a test stimulus provided via an external PCIe interface. The S2P interface may convert the stimulus to a parallel test protocol, which is subsequently applied, for example, to a scan interface or a memory BIST interface (not shown). A response from such a scan interface or memory BIST interface may be converted from parallel to a serial format by a parallel-to-serial (P2S) interface and sent from system 700 via the external PCIe port 712.

By way of illustration and not limitation, system 700 may use PCIe port 712 (or a TBT port, in another embodiment) to capture a serial test stream and, for example, convert it to a parallel data communication—e.g., with de-serializer logic such as the illustrative serial-to-parallel circuit S2P 780. The parallelized data may be output from S2P 780 to parallel registers 782—e.g., including test mode I/O registers and/or status registers—for use in loading a scan-chain. The loaded scan-chain may be subsequently latched out for performance of a test. The test may result in an output of test data that is captured and serialized—e.g., via serializer logic of P2S 782—and communicated via PCIe port 720 to an external tester unit (not shown) that is coupled to system 700. Such an exchange may take place for debugging, testing, validation and/or the like. PCIe port 720 (or TBT interface, in another embodiment) may thus be used to facilitate scan chain testing, memory testing, I/O testing other tests to evaluate and/or any of various other components of system 700. In some embodiments, other test mode commands and/or test responses may be exchanged between a PCIe interface via a TAP network—independent of any such S2P and P2S functionality—to facilitate any of various other test modes. Access to the PCIe infrastructure may be provided by Thunderbolt™ or a M.2 interface (not shown), i.e., where a plug-in card can be removed to get access to PCIe.

Some embodiments provide for loading debug and/or test (debug/test) commands into an agent running, for example, in one component, to perform TDT operations that evaluate another component. With reference to the example embodiment of system 200, TDT logic 242 of AP 240 may execute a debug/test agent based on software code provided by an external TDT unit via I/O interface 210 and TAP network 230. Execution of such a debug/test agent may evaluate modem BBP 260, for example. I/O interface 210 (such as a PCIe interface) may be used to load to AP 240 the test/debug agent code and/or commands to be serviced by the debug/test agent. The debug/test agent may additionally or alternatively evaluate AP 240 and/or modem Tx/Rx 280, for example. A response from the evaluated component(s) may be sent back to the debug/test agent at AP 240, and may subsequently be related to the external TDT unit via I/O interface 210.

Alternatively or in addition, a debug/test agent (or other TDT agent) may be loaded in any of a variety of other system components that are capable or running and executing such firmware and/or software. With reference again to system 200, a debug/test agent may instead be loaded to be run by processor logic (e.g., TDT logic 262) that resides in controller circuitry of modem BBP 260. Commands may be loaded into such a debug/test agent of modem BBP 260 to debug/test AP 240, for example. I/O interface 210 may be used to load such a debug/test agent of modem BBP 260 with debug/test commands to test modem BBP 260, AP 240 modem Tx/Rx 280 and/or any other suitably configured component of system 200.

Figure 8A:
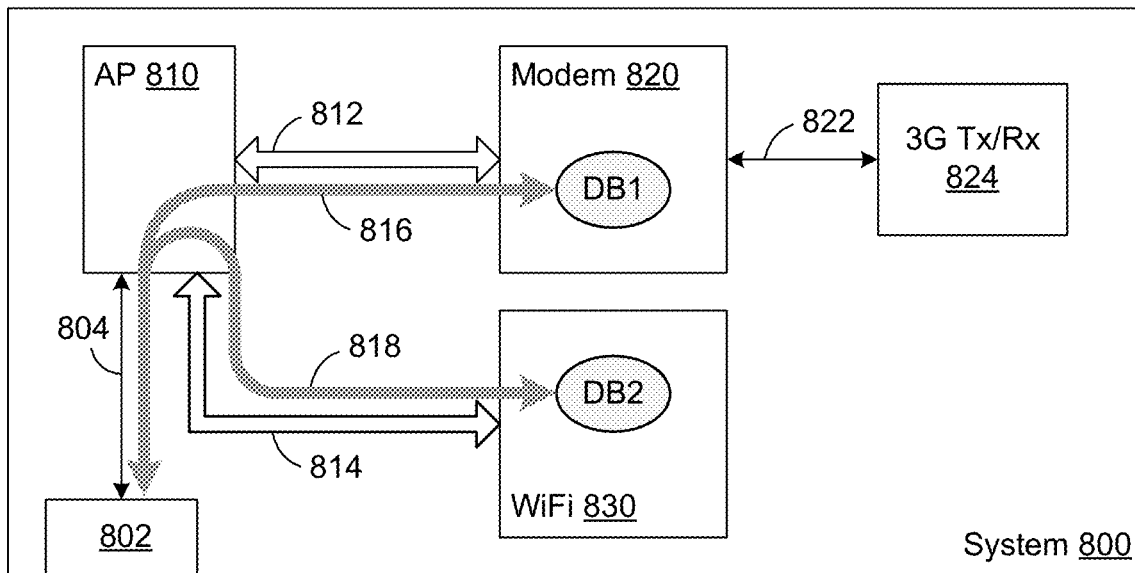
FIGS. 8A, 8B are functional block diagrams each illustrating elements of a respective system to evaluate one or more circuit components according to a corresponding embodiment.
Figure 8B:
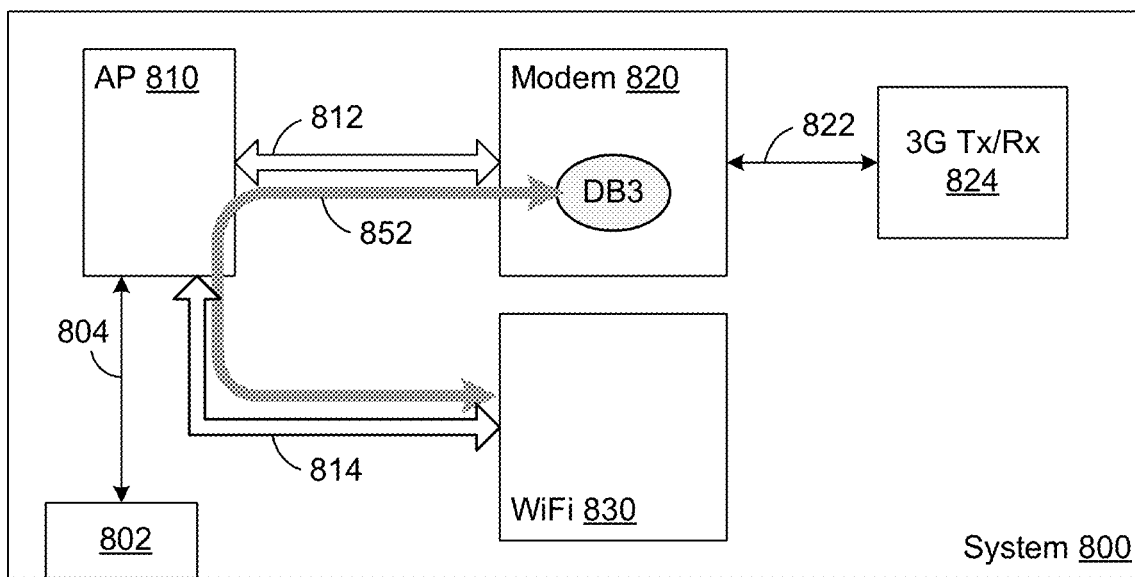
Figure 8B:

FIGS. 8A, 8B variously illustrate elements a system 800 to perform various TDT operations each according to a corresponding embodiment. System 800 may include features of one of systems 200, 400, 500, 600 and 700, for example. In one embodiment, some or all of method 300 is performed at system 800. As shown in FIG. 8A, system 800 may include an application processor AP 810 coupled via a link 804 to receive commands from an external debug/test agent (not shown) that, for example, is coupled to system 800 via interface hardware 802. In one embodiment, interface hardware 802 comprises an external (e.g., PCIe or Thunderbolt™) interface. Hardware 802 may further comprise a TAP network and glue logic to interface with the external interface. In some embodiment, glue logic is additionally or alternatively provided in another component of system 800, such as the illustrative AP 810.

Using AP 810, one or more PCIe links within system 800, such as the illustrative interconnects 812, 814, may be accessed to load one or more agents—e.g., each on a respective one of modem 820, WiFi 830 and/or any of various other components. Telephony communication may be provided with a 3G Tx/Rx 824 that is coupled via a link 822 to modem 820. Some or all of such one or more agents may variously perform respective debugging and/or testing. For example, an agent loaded to run on one component may perform debugging and/or testing to evaluate that same component or some other component of system 800. By way of illustration and not limitation, AP 810 may facilitate an exchange 816 of debug information between the external interface of hardware 802 and a debug process DB1 executed by a processor of modem 820. Additionally or alternatively, AP 810 may facilitate an exchange 818 of debug information between the external interface of hardware 802 and another debug process DB2 executed by a processor of WiFi 830. In some embodiments, WiFi 830 may instead be any of various wireless mechanisms, such as Bluetooth, Bluetooth-LE, NFC, 3G, 4G-LTE, 5G etc.

In the illustrative embodiment of FIG. 8B, an external agent may exchange executable code, test/debug commands and/or other TDT information via wireless communications 850. For example, debug commands may be downloaded wirelessly to WiFi 830, and subsequently sent to modem 820 via AP 810 and interconnects 812, 814. WiFi 830 and AP 810 may thus facilitate an exchange 852 of debug information between the external agent and a debug process DB3 executed at modem 820. Use of PCIe network structures of system 800 may enable sustained high-speed communication of debug and/or other DTD information.

Figure 9A:
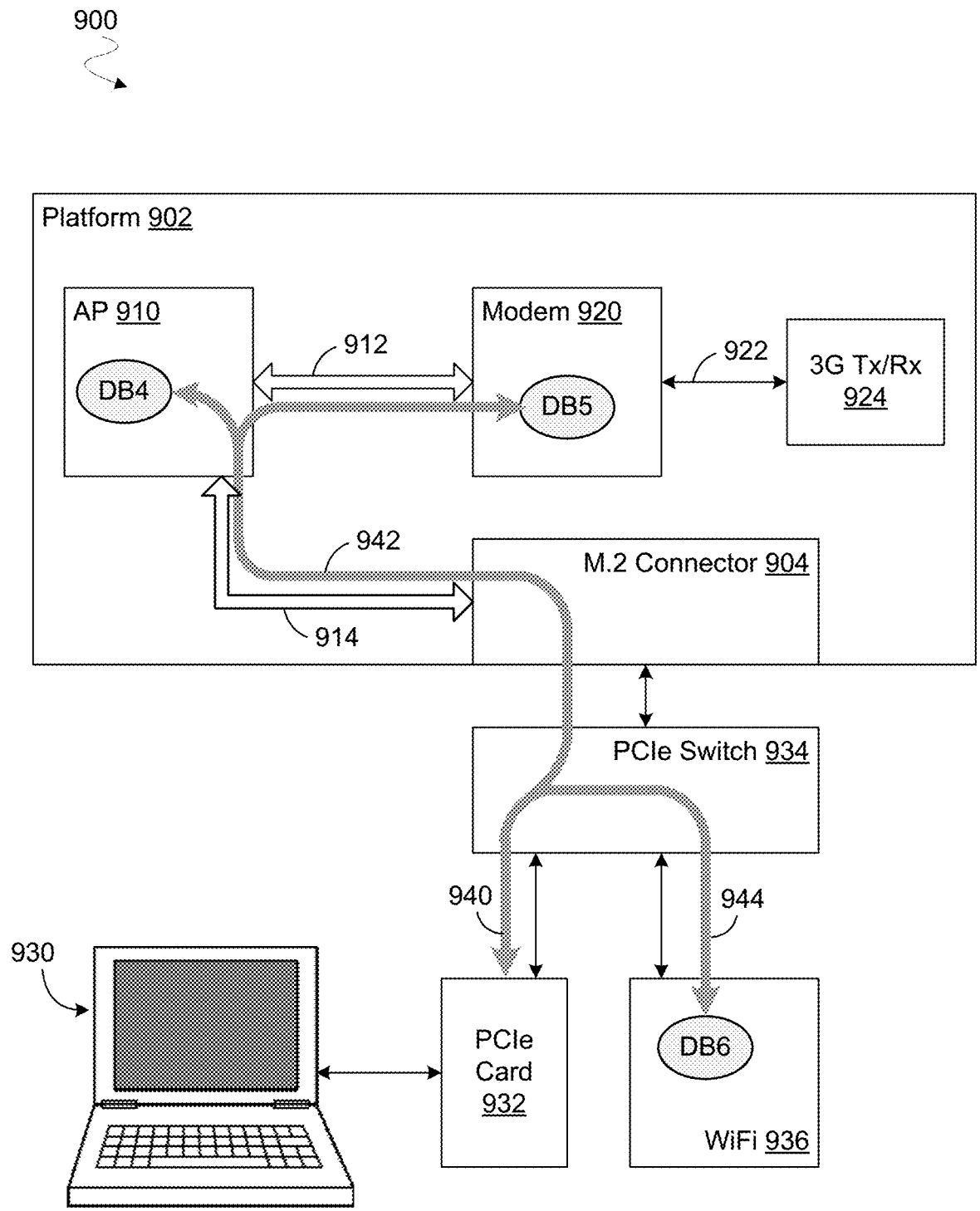
FIGS. 9A, 9B are functional block diagrams each illustrating elements of a respective system to evaluate one or more circuit components according to a corresponding embodiment.
Figure 9B:
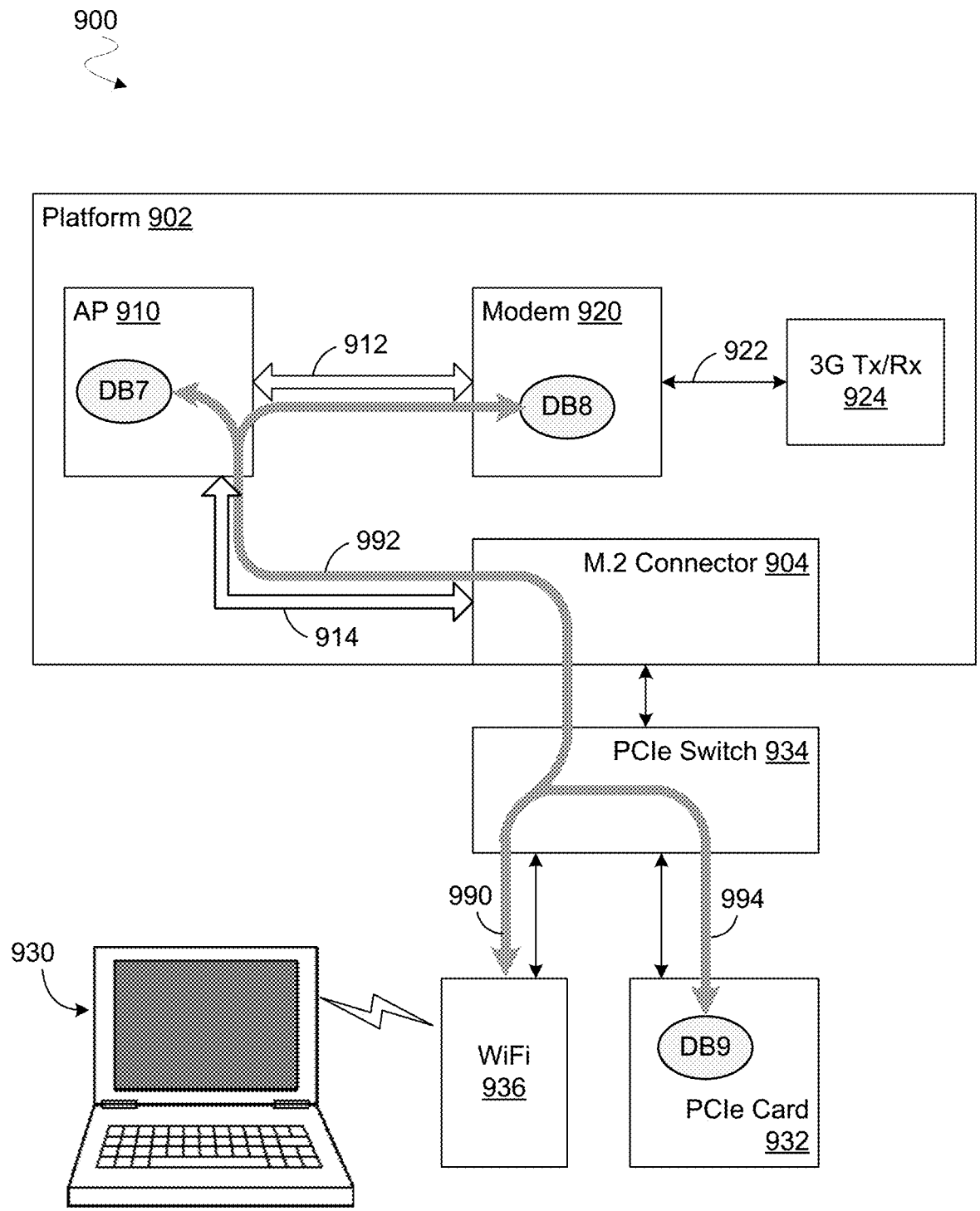

FIGS. 9A, 9B illustrate TDT operations various performed, each according to a corresponding embodiment, by a system 900. System 900 may include features of system 800, for example. In one embodiment, some or all of method 300 is performed at system 900.

As shown in FIG. 9A, system 900 may include a platform 902 that, for example, includes features of system 800. An external port, such as the illustrative M.2 connector 904, may couple platform 902 to one or more external devices of system 900. In one example, embodiment, such external devices include a PCIe switch 934, wireless communication circuitry WiFi 936 and a PCIe card 932. However, platform 902 may be coupled to fewer, more and/or different external devices, in other embodiments. In addition to platform 902, some or all such external devices may to be evaluated by a DTD unit 930.

Components of platform 902 may include an AP 910, modem 920 and 3G Tx/Rx 924 that, for example, provide functionality corresponding to the respective functionality of AP 810, modem 820 and 3G Tx/Rx 824. Interconnection of such components with each other and M.2 connector 904 may be provided with interconnects 912, 942 and a link 922 (e.g., having functionality corresponding to the respective functionality of interconnects 812, 842 and link 822). TDT operations performed with DTD unit 930 may variously exchange trace, debug and/or test information via a networked arrangement of platform 902, PCIe switch 934, Wifi 936 and PCIe card 940. Glue logic (not shown) may be variously included in some or all such components of the network—e.g., where such glue logic is to interface a general purpose functional interface (such as M.2 connector 904) with a TAP network.

As shown in the illustrative embodiment represented by FIG. 9A, PCIe switch 934 may be used to provide communication by M.2 connector 904 with either the discrete PCIe card 932 or the discrete WiFi 936. TDT unit 930 may participate in wired communications with PCIe card 932—e.g., in support of one or more exchanges such as the illustrative exchanges 940, 944, 942 shown. For example, an exchange 940 between PCIe card 932 and PCIe switch 934 may facilitate one or both of downstream exchanges 942, 944. The exchange 942 may variously communicate respective TDT information between M.2 connector 904 and one or both of AP 910 and modem 920. Based on exchange 942, one or more test/debug agents may variously execute each at a respective component of platform 902. By way of illustration and not limitation, AP 910 may execute a debug process DB4 and/or modem 920 may execute a debug process DB5. Alternatively or in addition, exchange 944 may result in, or be based on, operations by a debug process DB6 executing at PCIe card 932.

In the embodiment represented by FIG. 9B, TDT unit 930 may participate in wireless communications with WiFi 936—e.g., in addition to or instead of wired communications with PCIe card 932. Such wireless communications may facilitate exchanges of TDT information, such as the illustrative exchanges 990, 992, 994 shown. The exchange 990 between WiFi 936 and PCIe switch 934 may facilitate one or both of downstream exchanges 992, 994. Based on exchange 992, one or more test/debug agents may variously execute each at a respective component of platform 902. By way of illustration and not limitation, AP 910 may execute a debug process DB7 and/or modem 920 may execute a debug process DB8. Alternatively or in addition, exchange 994 may result in, or be based on, operations by a debug process DB9 executing at PCIe card 932.

Figure 10:
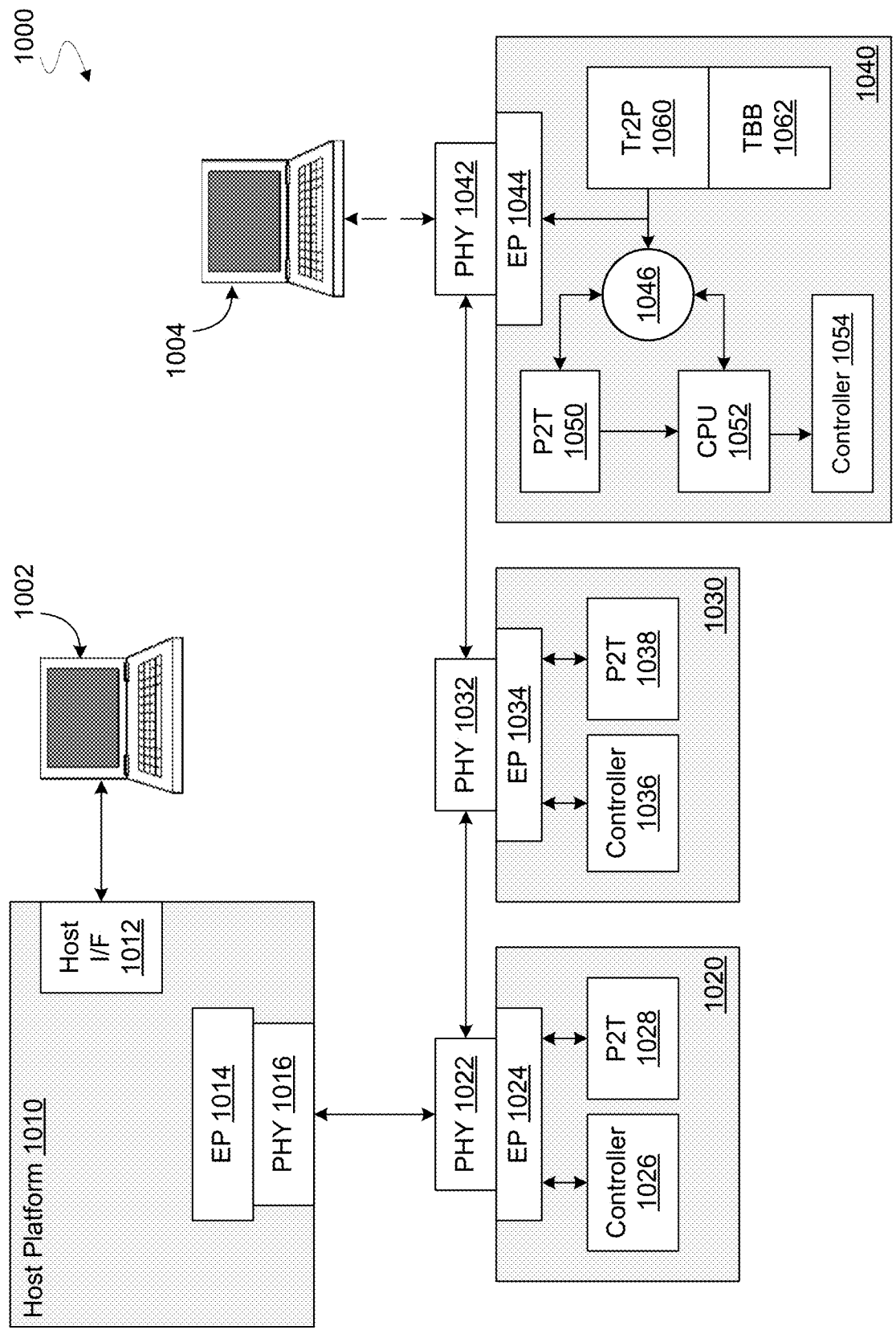
FIG. 10 is a functional block diagram illustrating elements of a system to perform TDT evaluations of daisy-chained devices according to an embodiment.

FIG. 10 illustrates a system 1000 to perform TDT operations according to an embodiment. System 1000 may include features of one of systems 200, 400, for example. In one embodiment, some or all of method 300 is performed at system 1000. System 1000 includes multiple devices arranged, according to an embodiment, in a daisy chain configuration for TDT operations and/or communications. The daisy chained devices may be coupled to one another via respective functional interfaces (e.g., including PCIe interfaces and/or TBT interfaces). A TDT host included in or coupled to system 1000—e.g., one of TDT units 1002, 1004—may be located at an end of daisy chained connections each between successive devices. Such devices may each include respective glue logic (e.g., including PCIe2TAP circuitry, TBT2TAP circuitry, bus access mechanisms or the like) to variously aid in TDT operations/communications between functional interface mechanisms and respective test access points of internal device components.

In the illustrative embodiment of system 1000 the daisy chained devices includes a host platform 1010 having, for example, some or all features of host 410. Host platform 1010 and other devices 1020, 1030, 1040 may be coupled in series to one another via respective physical layers PHY 1016, 1022, 1032, 1042 and respective endpoints EP 1014, 1024, 1034, 1044. In one embodiment, a host interface 1012 of host platform 1010 enables connection of a TDT unit 1002 at one end of the daisy chain configuration. Controllers 1026, 1036, 1054 of devices 1020, 1030, 1040 variously provide processor functionality each to perform respective TDT operations. For some or all of devices 1020, 1030, 1040, respective glue logic (e.g., one of the various PCIe2TAP interface circuitry P2T 1028, P2T 1038, P2T 1050 shown) may interface local PCIe mechanisms of the device with TAP network structures of the device. One or more devices may include additional or alternative architecture to facilitate TDT operations. For example, device 1040 may include a trace backbone TBB 1062 to support trace functionality that, for example, is adapted from conventional techniques. Glue logic Tr2P 1060 of device 1040 may interface TBB 1060 with PCIe mechanisms of device 1040. In an embodiment, such PCIe mechanisms may include or couple to a switch 1046 by which P2T 1050, controller 1054 and EP 1044 communicate with each other and, for example, a CPU 1052.

In some embodiments, a device's PCIe/TBT interface may be coupled to a separate power rail of that device, such as a debug power rail. This may enable relatively early and/or low power state debug operations. PCIe/Thunderbolt™ interfaces typically turn on after other components during system wake up, power on, etc. This is because users typically do not need a high speed interface when a modem (or other component) initially wakes up. For example, users listening to music do not want an unused Thunderbolt™ interface to be consuming power at the same time. However, placing such a functional (e.g., in-band) interface on an independent power rail may enable early power up of the interface at least for TBT functionality—e.g., to debug audio logic, a power management controller (PMC) and/or other any of various other relatively low power components.

Figure 11:
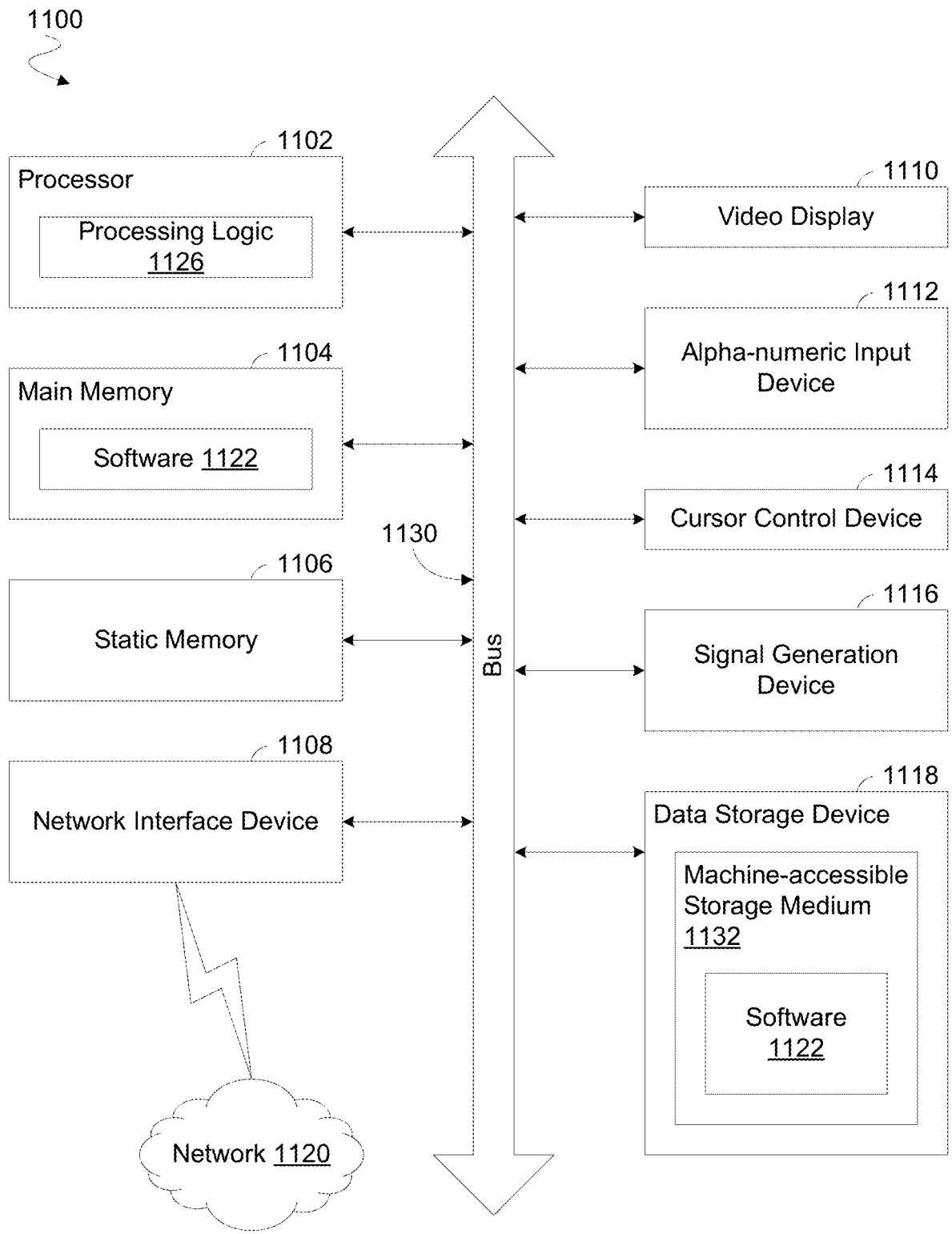
FIG. 11 is a functional block diagram illustrating an exemplary computer device, in accordance with one embodiment.

FIG. 11 illustrates a diagrammatic representation of a machine in the exemplary form of a computer system 1100 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1100 includes a processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

Processor 1102 represents one or more general-purpose processing devices such as a microprocessor, central processing unit, or the like. More particularly, the processor 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1102 may also be one or more special-purpose processing devices such as an application specific integrated circuit (ASIC), a field programmable gate array (FPGA), a digital signal processor (DSP), network processor, or the like. Processor 1102 is configured to execute the processing logic 1126 for performing the operations described herein.

The computer system 1100 may further include a network interface device 1108. The computer system 1100 also may include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium (or more specifically a computer-readable storage medium) 1132 on which is stored one or more sets of instructions (e.g., software 1122) embodying any one or more of the methodologies or functions described herein. The software 1122 may also reside, completely or at least partially, within the main memory 1104 and/or within the processor 1102 during execution thereof by the computer system 1100, the main memory 1104 and the processor 1102 also constituting machine-readable storage media. The software 1122 may further be transmitted or received over a network 1120 via the network interface device 1108.

While the machine-accessible storage medium 1132 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a device comprises an input/output (I/O) interface to couple the device to an external agent and to exchange information with the external agent, wherein the I/O interface is compatible with a peripheral interconnect standard that supports communication of operational data other than any test information, debug information or trace information. The device further comprises a first network, a plurality of circuit components coupled to to one another via the first network, wherein the first network includes a network of test access points coupled between the plurality of circuit components and the I/O interface, and glue logic to exchange the information between the network of test access points and the I/O interface, wherein the plurality of circuit components includes circuitry to perform a test, debug or trace (TDT) operation to evaluate one of the plurality of circuit components, wherein the TDT operation generates the information or is in response to the information.

In an embodiment, the glue logic to exchange the information between the network of test access points and the I/O interface includes the glue logic to adjust a communication of the information between a first rate of the I/O interface and a second rate of the network of test access points. In another embodiment, the glue logic includes one or more buffers, wherein the glue logic to adjust a communication of the information between the first rate and the second rate includes the glue logic to buffer and debuffer data at different respective rates. In another embodiment, the device further comprises a bus access unit, and a second network coupled to the first network via the bus access unit, wherein the bus access unit includes circuitry to adjust between different respective communication rates of the first network and the second network, wherein the glue logic to exchange the information between the network of test access points and the I/O interface includes the glue logic to exchange memory mapped I/O information accessed via the second network. In another embodiment, the peripheral interconnect standard is a Peripheral Component Interconnect Express (PCIe) standard or a Thunderbolt™ standard. In another embodiment, the information includes software code provided to the plurality of circuit components by the external agent, wherein the plurality of circuit components to perform the TDT operation includes a first circuit component to execute the software code. In another embodiment, the TDT operation is to evaluate a second circuit component of the plurality of circuit components, the second circuit component other than the first circuit component.

In another implementation, a method comprises coupling a device to an external agent via an input/output (I/O) interface of the device, the device including a plurality of circuit components and a first network coupling the plurality of circuit components to one another, the first network including a network of test access points coupled between the plurality of circuit components and the I/O interface, wherein the I/O interface is compatible with a peripheral interconnect standard that supports communication of operational data other than any test information, debug information or trace information, exchanging information via the I/O interface with the external agent, exchanging the information, via glue logic of the device, between the network of test access points and the I/O interface, and performing a test, debug or trace (TDT) operation to evaluate one of the plurality of circuit components, wherein the TDT operation generates the information or is in response to the information.

In an embodiment, exchanging the information between the network of test access points and the I/O interface includes the glue logic adjusting communication of the information between a first rate of the I/O interface and a second rate of the network of test access points. In another embodiment, the glue logic includes one or more buffers, wherein the glue logic adjusting communication of the information between the first rate and the second rate includes the glue logic to buffer and debuffer data at different respective rates. In another embodiment, exchanging the information via the glue logic between the network of test access points and the I/O interface includes the glue logic exchanging memory mapped I/O information accessed via a second network of the device, and adjusting communication of the memory mapped I/O information between different respective communication rates of the first network and the second network. In another embodiment, the peripheral interconnect standard is a Peripheral Component Interconnect Express (PCIe) standard or a Thunderbolt™ standard. In another embodiment, the information includes software code provided to the plurality of circuit components by the external agent, wherein performing the TDT operation includes a first circuit component of the plurality of circuit components executing the software code. In another embodiment, the TDT operation is to evaluate a second circuit component of the plurality of circuit components, the second circuit component other than the first circuit component.

In another implementation, a system comprises a system-on-chip (SoC) including an input/output (I/O) interface to couple the SoC to an external agent and to exchange information with the external agent, wherein the I/O interface is compatible with a peripheral interconnect standard that supports communication of operational data other than any test information, debug information or trace information. The SoC further includes a first network, a plurality of circuit components coupled to to one another via the first network, wherein the first network includes a network of test access points coupled between the plurality of circuit components and the I/O interface, and glue logic to exchange the information between the network of test access points and the I/O interface, wherein the plurality of circuit components includes circuitry to perform a test, debug or trace (TDT) operation to evaluate one of the plurality of circuit components, wherein the TDT operation generates the information or is in response to the information. The system further comprises a display coupled to the SoC, the display to generate an image based on operational data exchanged via the I/O interface.

In an embodiment, the glue logic to exchange the information between the network of test access points and the I/O interface includes the glue logic to adjust a communication of the information between a first rate of the I/O interface and a second rate of the network of test access points. In another embodiment, the glue logic includes one or more buffers, wherein the glue logic to adjust a communication of the information between the first rate and the second rate includes the glue logic to buffer and debuffer data at different respective rates. In another embodiment, the SoC further comprises a bus access unit, and a second network coupled to the first network via the bus access unit, wherein the bus access unit includes circuitry to adjust between different respective communication rates of the first network and the second network, wherein the glue logic to exchange the information between the network of test access points and the I/O interface includes the glue logic to exchange memory mapped I/O information accessed via the second network. In another embodiment, the peripheral interconnect standard is a Peripheral Component Interconnect Express (PCIe) standard or a Thunderbolt™ standard. In another embodiment, the information includes software code provided to the plurality of circuit components by the external agent, wherein the plurality of circuit components to perform the TDT operation includes a first circuit component to execute the software code. In another embodiment, the TDT operation is to evaluate a second circuit component of the plurality of circuit components, the second circuit component other than the first circuit component.

Techniques and architectures for supporting test, debug and/or trace functionality are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A system comprising:
    integrated circuitry comprising:
    a functional interface compatible with a Peripheral Component Interconnect Express (PCIe)-based protocol, wherein the functional interface is to receive information associated with a test, debug, or trace (TDT) operation;
    a component comprising circuitry to perform the TDT operation at least partially based on the information associated with the TDT operation;
    first interface logic coupled between the component and the functional interface, wherein the information associated with the TDT operation is received from the functional interface to the component via the first interface logic; and
    second interface logic coupled to the first interface logic and to a memory or I/O space, wherein data associated with the TDT operation is to be accessed from the memory or the I/O space, via the second interface logic, based on memory mapped input/output (MMIO) information.

2. The system of claim 1, wherein the information associated with the TDT operation is received from an external system.

3. The system of claim 1, further comprising:
    a network coupled to the component and the first interface logic, wherein the network is to transfer the information associated with the TDT operation between the first interface logic and the component.

4. The system of claim 1, wherein the component generates output data associated with the TDT operation, and wherein the output data associated with the TDT operation is transferred from the component to the functional interface via the first interface logic.

5. The system of claim 1, wherein the functional interface is to provide general-purpose PCIe-based exchanges.

6. The system of claim 1, further comprising a server computing system.

7. The system of claim 6, wherein the server computing system comprises a blade server or a rack mount server.

8. The system of claim 1, wherein the integrated circuitry is on a system-on-chip (SoC).

9. The system of claim 1, wherein the integrated circuitry is on a field programmable gate array (FPGA).

10. The system of claim 1, further comprising:
    second integrated circuitry comprising:
    a second functional interface compatible with a Peripheral Component Interconnect Express (PCIe)-based protocol, wherein the second functional interface is to couple to an external system, and wherein information associated with a second test, debug, or trace (TDT) operation is received from the external system over the second functional interface; and
    a second component comprising circuitry to perform the second TDT operation at least partially based on the information associated with the second TDT operation; and
    third interface logic coupled between the second component and the second functional interface, wherein the information associated with the second TDT operation is exchanged from the second functional interface to the component via the third interface logic, and
    wherein the second functional interface is to provide PCIe-based exchanges with the functional interface.

11. The system of claim 1, further comprising a central processing unit (CPU), wherein the CPU is external to the integrated circuitry, and wherein the CPU is to couple to the integrated circuitry.

12. A system comprising:
    integrated circuitry comprising:
    a functional interface compatible with a Peripheral Component Interconnect Express (PCIe)-based protocol, wherein the functional interface is to receive information associated with a test, debug, or trace (TDT) operation from an external system;
    a network to transfer the information associated with the TDT operation to a component, wherein the component is to perform the TDT operation at least partially based on the information associated with the TDT operation;
    first interface logic coupled between the network and the functional interface, wherein the information associated with the TDT operation is exchanged from the functional interface to the network via the first interface logic; and
    second interface logic coupled to the first interface logic and to a memory or I/O space, wherein data associated with the TDT operation is to be accessed from the memory or I/O space, via the second interface logic, based on memory mapped input/output (MMIO) information.

13. The system of claim 12, further comprising a server computing system.

14. The system of claim 12, wherein the integrated circuitry is on a field programmable gate array (FPGA).

15. The system of claim 12, further comprising a central processing unit (CPU), wherein the CPU is external to the integrated circuitry, and wherein the CPU is to couple to the integrated circuitry.

16. A system for server computing comprising:
    integrated circuitry comprising:
    a functional interface compatible with a Peripheral Component Interconnect Express (PCIe)-based protocol, wherein the functional interface is to couple to an external system, and wherein information associated with a test, debug, or trace (TDT) operation is transferred to or from the external system over the functional interface;

a network to transfer the information associated with the TDT operation to or from a component, wherein the component is to perform the TDT operation;

first interface logic coupled between the network and the functional interface, wherein the information associated with the TDT operation is exchanged between the functional interface and the network via the first interface logic; and second interface logic coupled to the first interface logic and to a memory or I/O space, wherein data associated with the TDT operation is to be accessed from the memory or the I/O space based on memory mapped input/output (MMIO information) via the second interface logic; and a central processing unit (CPU), wherein the CPU is external to the integrated circuitry, and wherein the CPU is to couple to the integrated circuitry.

17. The system of claim 16, wherein the functional interface is to provide general-purpose PCIe-based exchanges.

18. The system of claim 16, further comprising a blade server or a rack mount server.

19. The system of claim 16, wherein the integrated circuitry is on a field programmable gate array (FPGA).

20. The system of claim 16, further comprising:

second integrated circuitry comprising:

a second functional interface compatible with a Peripheral Component Interconnect Express (PCIe)-based protocol, wherein the second functional interface is to couple to the external system, and wherein information associated with a second test, debug, or trace (TDT) operation is transferred to or from the external system over the second functional interface; and a second network to transfer the information associated with the second TDT operation to or from a second component, wherein the second component is to perform the second TDT operation; and third interface logic coupled between the second network and the second functional interface, wherein the information associated with the second TDT operation is exchanged between the second functional interface and the second network via the third interface logic, and wherein the second functional interface is to provide PCIe-based exchanges with the functional interface.

* * * * *